(12) United States Patent (10) Patent No.: US 8,081,052 B2
Kim et al. (45) Date of Patent: Dec. 20, 2011

(54) ELECTROMAGNETIC BANDGAP STRUCTURE AND PRINTED CIRCUIT BOARD

(75) Inventors: Han Kim, Yongin-si (KR); Ja-Bu Koo, Suwon-si (KR); Dae-Hyun Park, Ulsan (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 487 days.

(21) Appl. No.: 12/270,403

(22) Filed: Nov. 13, 2008

(65) Prior Publication Data

US 2009/0322450 A1 Dec. 31, 2009

(30) Foreign Application Priority Data

Jun. 27, 2008 (KR) .................. 10-2008-0062000

(51) Int. Cl.
*H01P 3/08* (2006.01)
(52) U.S. Cl. ...................... 333/246; 333/167
(58) Field of Classification Search ............ 333/167, 333/246; 174/262, 264, 265; 361/780, 803; 257/277, 698
See application file for complete search history.

(56) References Cited

U.S. PATENT DOCUMENTS

| 6,483,045 | B1 * | 11/2002 | Wang et al. ............ 174/264 |
| 7,204,018 | B2 * | 4/2007 | Kwong et al. ............ 29/837 |
| 2009/0039984 | A1 * | 2/2009 | Kim et al. ............ 333/212 |

FOREIGN PATENT DOCUMENTS

| JP | 10-209726 | 8/1998 |
| JP | 2004-032232 | 1/2004 |

OTHER PUBLICATIONS

Japanese Office Action, with Partial English Translation, issued in Japanese Patent Application No. 2008-295834, dated Feb. 1, 2011.

* cited by examiner

*Primary Examiner* — Robert Pascal
*Assistant Examiner* — Kimberly Glenn
(74) *Attorney, Agent, or Firm* — McDermott Will & Emery LLP

(57) ABSTRACT

An electromagnetic bandgap structure and a printed circuit board having the same are disclosed. In accordance with an embodiment of the present invention, the electromagnetic bandgap structure can include a plurality of conductive layers, placed between two conductive layers; and a stitching via, configured to make an electrical connection between any two conductive layers of the conductive layers. Here, the stitching via can include a first via, one end part of the first via configured to any one of the two conductive plates; a second via, one end part of the second via configured to the other of the two conductive plates; and a connection pattern, placed on a planar surface that is different from the conductive plates, between the two conductive layers and configured to make an electrical connection between the other end part of the first via and the other end part of the second via. Any one of the first via and the second via can be formed to penetrate a same planar surface as at least one of the two conductive layers.

9 Claims, 26 Drawing Sheets

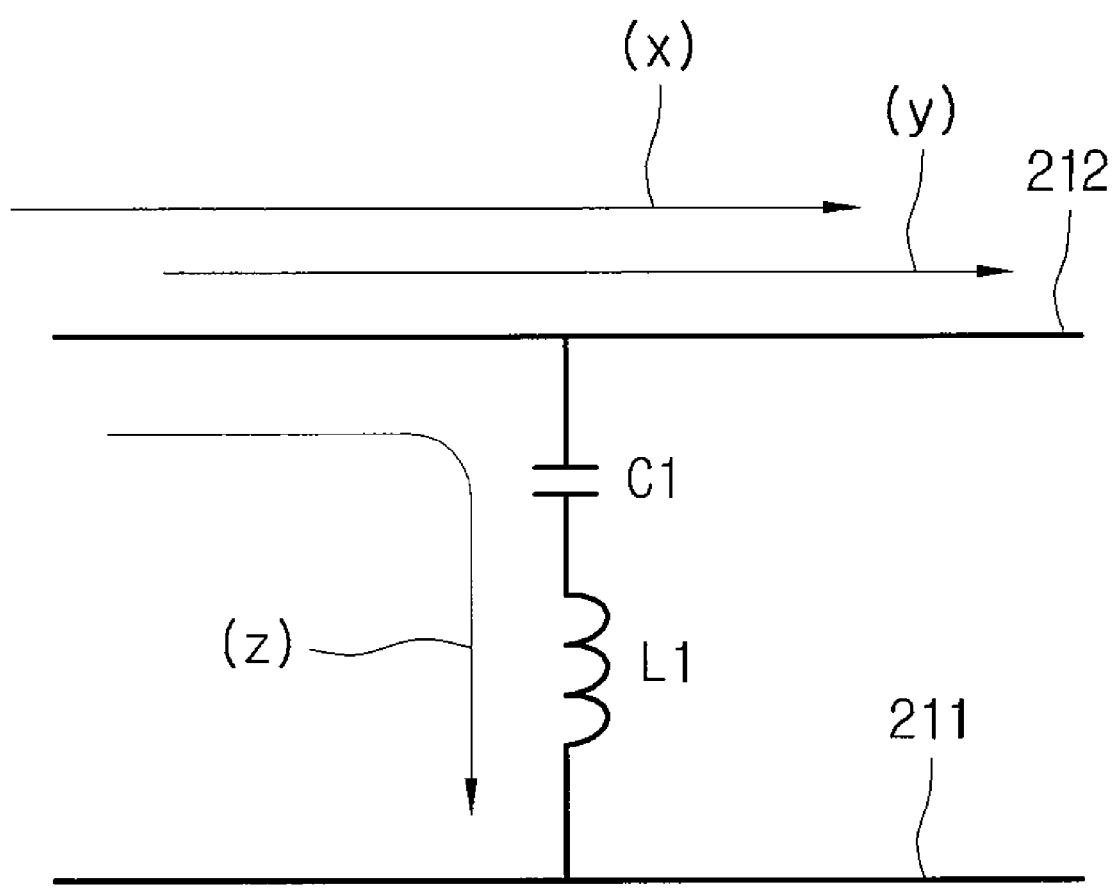

ELECTROMAGNETIC BANDGAP STRUCTURE AND PRINTED CIRCUIT BOARD

CROSS-REFERENCE TO RELATED PATENT APPLICATIONS

This application claims the benefit of Korean Patent Application No. 10-2008-0062000, filed on Jun. 27, 2008, in the Korean Intellectual Property Office, the disclosure of which is incorporated herein in their entirety by reference.

BACKGROUND OF THE INVENTION

1. Field of the Invention

The present invention relates to an electromagnetic bandgap structure, more specifically to an electromagnetic bandgap structure and a printed circuit board having the same that prevent a signal ranging a predetermined frequency band from being transmitted.

2. Background Art

New electronic apparatuses and communication apparatuses are increasingly becoming smaller, thinner and lighter, reflecting today's emphasis on growing mobility.

These electronic and communication apparatuses have various complex electronic circuits (i.e. analog circuits and digital circuits) for performing their functions and operations. These electronic circuits typically carry out their functions by being implemented in a printed circuit board (PCB). The electronic circuits on the PCB commonly have different operation frequencies from one another.

The printed circuit board in which various electronic circuit boards are implemented often has a noise problem, caused by the transfer and interference of an electromagnetic (EM) wave resulted from the operation frequency and its corresponding harmonics components of one electronic circuit to another electronic circuit. The transferred noise can be roughly classified into radiation noise and conduction noise.

The radiation noise (refer to the reference numeral 155 of FIG. 1) can be easily prevented by covering a protective cap on the electronic circuit. However, preventing the conduction noise (refer to the reference numeral 150 of FIG. 1) is not as easy, because the conduction noise is transferred through a signal transfer path inside the board.

The noise problem will be described in more detail with reference to FIG. 1. FIG. 1 is a sectional view showing a printed circuit board including two electronic circuits having different operation frequencies. Although FIG. 1 shows a 4-layered printed circuit board 100, it shall be obvious that the printed circuit board can be modified to have a 2, 6 or 8-layered structure.

As shown in FIG. 1, the printed circuit board 100 includes metal layers 110-1, 110-2, 110-3 and 110-4 (hereinafter, collectively referred to as 110) and dielectric layers 120-1, 120-2 and 120-3 (hereinafter, collectively referred to as 120) interposed between metal layers 110. The top metal layer 110-1 of the printed circuit board 100 is implemented with two electronic circuits 130 and 140 having different operation frequencies (hereinafter, referred to as a first electronic circuit 130 and a second electronic circuit 140, respectively). Here, both of the first electronic circuit 130 and the second electronic circuit 140 are assumed to be digital circuits.

Here, if it is assumed that the metal layer represented by the reference numeral 110-2 is a ground layer and the metal layer represented by the reference numeral 110-3 is a power layer, each ground pin of the first electronic circuit 130 and the second electronic circuit 140 is electrically connected to the metal layer represented by the reference numeral 110-2 and each power pin is electrically connected to the metal layer represented by the reference numeral 110-3. In the printed circuit board 100, every ground layer is also electrically connected to each other through vias. Similarly, every power layer is also electrically connected to each other through vias (refer to the reference numeral 160 of FIG. 1).

If the first electronic circuit 130 and the second electronic circuit 140 have different operation frequencies, a conductive noise 150 caused by an operation frequency of the first electronic circuit 130 and its harmonics components is transferred to the second electronic circuit 140 as shown in FIG. 1. This has a disadvantageous effect on the accurate function/operation of the second electronic circuit 140.

With the growing complexity of electronic apparatuses and higher operation frequencies of digital circuits, it is increasingly more difficult to solve this conduction noise problem. Especially, the typical bypass capacitor method or decoupling capacitor method for solving the conductive noise problem is no longer adequate, as the electronic apparatuses use a higher frequency band.

Moreover, the aforementioned solutions are not adequate when several active devices and passive devices need to be implemented in a complex wiring board having various types of electronic circuits formed on the same board or in a narrow area such as a system in package (SiP) or when a high frequency band is required for the operation frequency, as in a network board.

Accordingly, an electromagnetic bandgap structure (EBG) has currently come into the spotlight to solve the foresaid conductive noise problem. This aims to block a signal of a predetermined frequency band by disposing an electromagnetic bandgap structure having a predetermined structural shape in a printed circuit board.

An electromagnetic bandgap structure having a mushroom type structure as shown in FIG. 2A and FIG. 2B has been studied.

The electromagnetic bandgap structure 200 shown in FIG. 2A and FIG. 2B is formed by repeatedly arranging a mushroom type structure 230, which includes a metal plate 232 formed between the first metal layer 211 and the second metal layer 212 and a via 234 connecting the first metal layer 211 to the metal plate 232, between a first metal layer 211 and a second metal layer 212, each of which functions as a ground layer and a power layer. A first dielectric layer is interposed between the first metal layer 211 and the metal plate 232, and a second dielectric layer is interposed between the metal plate 232 and the second metal layer 212.

As such, arranging the mushroom type structure 230 between the first metal layer 211 and the second metal layer 212 repeatedly can allow a signal x of a low frequency band (refer to FIG. 2C and FIG. 2D) and a signal y of a high frequency band (refer to FIG. 2C and FIG. 2D) to pass through the electromagnetic bandgap structure 200 and block a signal z of a certain frequency band (refer to FIG. 2C and FIG. 2D) ranging between the low frequency band and the high frequency band. In other words, the electromagnetic bandgap structure 200 shown in FIG. 2A and FIG. 2B can function as a band stop filter blocking a signal of a certain frequency band. This can be easily understood through an equivalent circuit of FIG. 2C.

In the equivalent circuit of the mushroom type electromagnetic bandgap structure 200 shown in FIG. 2C, a capacitance component C1 and an inductance component L1 are connected in series between the first metal layer 211 and the second metal layer 212. Here, C1 is a capacitance component formed by the second metal layer 212, the second dielectric layer 222 and the metal plate 232, and L1 is an inductance component formed by the via 234 placed between the metal plate 232 and the first dielectric layer 221. As a result, the mushroom type bandgap structure 200 can function as a kind of band stop filter by this L-C serial connection.

However, it is difficult to apply the mushroom type electromagnetic bandgap structure 200 in various apparatuses because the mushroom type electromagnetic bandgap structure 200 functions as a band stop filter by using one inductance component and one capacitance component only. This is because the acquirable length (i.e. corresponding to an inductance value) of the via 234 is limited in the structural shape of FIG. 2A and FIG. 2B. The acquirable capacitance value is also limited because the mushroom type structure 230 is placed between two adjacent metal layers only.

As new electronic apparatuses and communication apparatuses are increasingly becoming smaller, thinner and lighter, it is more difficult to select a desired bandgap frequency band by using the mushroom type electromagnetic bandgap structure 200 only. In other words, the mushroom type electromagnetic bandgap structure 200 shown in FIG. 2A and FIG. 2B has some restrictions in adjusting each bandgap frequency band to meet conditions and features of various application apparatuses or to lower a conductive noise to a desired noise level in a pertinent bandgap frequency band.

Accordingly, it is necessarily required to study the structure of the electromagnetic bandgap that not only can outstandingly block or reduce a conductive noise between a power layer and a ground layer but also can be universally applied to various application apparatuses having different bandgap frequency bands.

It is also necessary to study the structure of an electromagnetic bandgap that can be applied to a multi-layered PCB structure with a simplified overall process by reducing the number of stacking operations and can be easily realized without an additional change of process.

SUMMARY OF THE INVENTION

The present invention provides an electromagnetic bandgap structure and a printed circuit board having the same that can block a conductive noise of a certain frequency band.

The present invention also provides an electromagnetic bandgap structure and a printed circuit board having the same that can solve a conductive noise by arranging an electromagnetic bandgap structure having a predetermined structural shape in a printed circuit board without using a bypass capacitor and a decoupling capacitor.

The present invention provides an electromagnetic bandgap structure and a printed circuit board having the same that can be applied to a multi-layered PCB structure with a simplified overall process by reducing the number of stacking operations and can be easily realized without an additional change of process.

The present invention provides an electromagnetic bandgap structure and a printed circuit board having the same that can give more suitable design flexibility and freedom to a multilayer printed circuit board and realize bandgap frequencies having various frequency bands, to thereby universally be applied to various application apparatuses and electronic apparatuses.

In addition, the present invention provides an electromagnetic bandgap structure and a printed circuit board having the same that can block a conductive noise of high frequency band when using an operation frequency of high frequency band in a network board, for example.

An aspect of the present invention features an electromagnetic bandgap structure including a plurality of conductive plates, placed between two conductive layers; and a stitching via, configured to make an electrical connection between any two of the conductive plates, where the stitching via can include a first via, one end part of the first via configured to any one of the two conductive plates; a second via, one end part of the second via configured to the other of the two conductive plates; and a connection pattern, placed on a planar surface that is different from the conductive plates, between the two conductive layers and configured to make an electrical connection between the other end part of the first via and the other end part of the second via. Here, any one of the first via and the second via can be formed to penetrate a same planar surface as at least one of the two conductive layers.

Here, the one of the first via and the second via formed to penetrate a same planar surface as at least one of the two conductive layers can be a plated through hole (PTH).

The one of the first via and the second via formed to penetrate a same planar surface as at least one of the two conductive layers can be electrically disconnected from a conductive layer on the same planar surface.

The other of the first via and the second via can be formed to penetrate a same planar surface as at least one of the two conductive layers.

The other of the first via and the second via formed to penetrate a same planar surface as at least one of the two conductive layers can be a plated through hole (PTH).

The other of the first via and the second via penetrating a same planar surface as at least one of the two conductive layers can be electrically disconnected from a conductive layer on the same penetrated planar surface.

If a conductive layer is placed on a same planar surface to correspond to an area in which the connection pattern is to be formed, the connection pattern can be accommodated in a clearance hole, which is formed on the conductive layer placed on the same planer surface as the connection pattern.

The conductive plates can be arranged in one or more row on some or all parts of a planar surface, between the two conductive layers.

Another aspect of the present invention features a printed circuit board, including an electromagnetic bandgap structure, arranged in an area of a noise transferable path between a noise source point and a noise blocking destination point of the printed circuit board, where the electromagnetic bandgap structure can include a plurality of conductive plates, placed between two conductive layers; and a stitching via, configured to make an electrical connection between any two of the conductive plates, and the stitching via can include a plurality of conductive plates, placed between two conductive layers; and a stitching via, configured to make an electrical connection between any two of the conductive plates. Here, any one of the first via and the second via can be formed to penetrate a same planar surface as at least one of the two conductive layers. Here, the one of the first via and the second via formed to penetrate a same planar surface as at least one of the two conductive layers can be a plated through hole (PTH).

The one of the first via and the second via formed to penetrate a same planar surface as at least one of the two conductive layers can be electrically disconnected from a conductive layer on the same planar surface.

The other of the first via and the second via can be formed to penetrate a same planar surface as at least one of the two conductive layers.

The other of the first via and the second via formed to penetrate a same planar surface as at least one of the two conductive layers can be a plated through hole (PTH).

The other of the first via and the second via penetrating a same planar surface as at least one of the two conductive layers can be electrically disconnected from a conductive layer on the same penetrated planar surface.

If a conductive layer is placed on a same planar surface to correspond to an area in which the connection pattern is to be formed, the connection pattern can be accommodated in a clearance hole, which is formed on the conductive layer placed on the same planer surface as the connection pattern.

At least one of the two conductive layers can form a layer that is different from the conductive plates with respect to electrical signals.

If two electronic circuits having different operation frequencies are implemented in the printed circuit board, the noise resource point and the noise blocking destination point can correspond to one position and another position, respectively, in which the two electric circuits are to be implemented.

The conductive plates can be arranged in one or more row on some or all parts of a planar surface, between the two conductive layers.

BRIEF DESCRIPTION OF THE DRAWINGS

These and other features, aspects and advantages of the present invention will become better understood with regard to the following description, appended claims and accompanying drawings where:

FIG. 2C shows an equivalent circuit of the electromagnetic bandgap structure shown in FIG. 2B;

DESCRIPTION OF THE EMBODIMENTS

Figure 1:
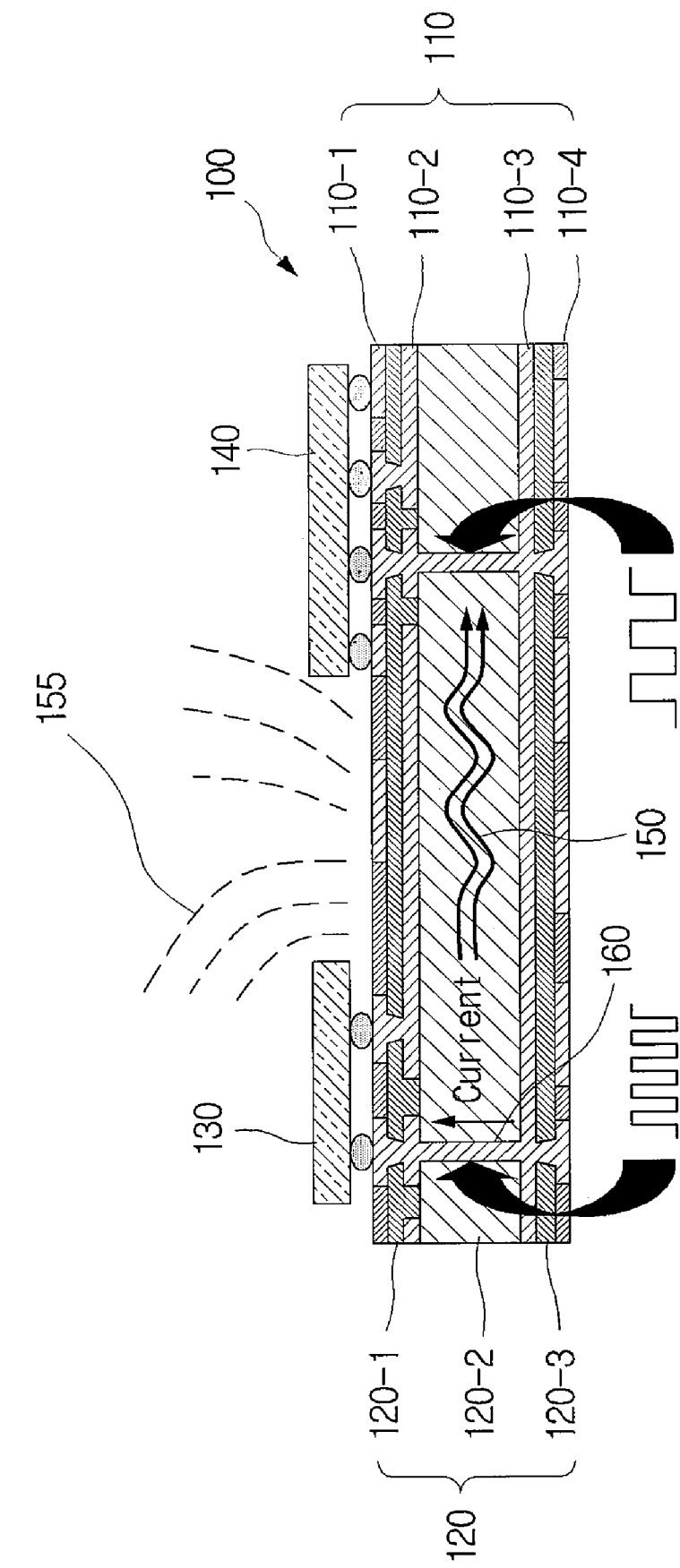
FIG. 1 is a sectional view showing a printed circuit board including two electronic circuits having different operation frequencies.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Figure 5:
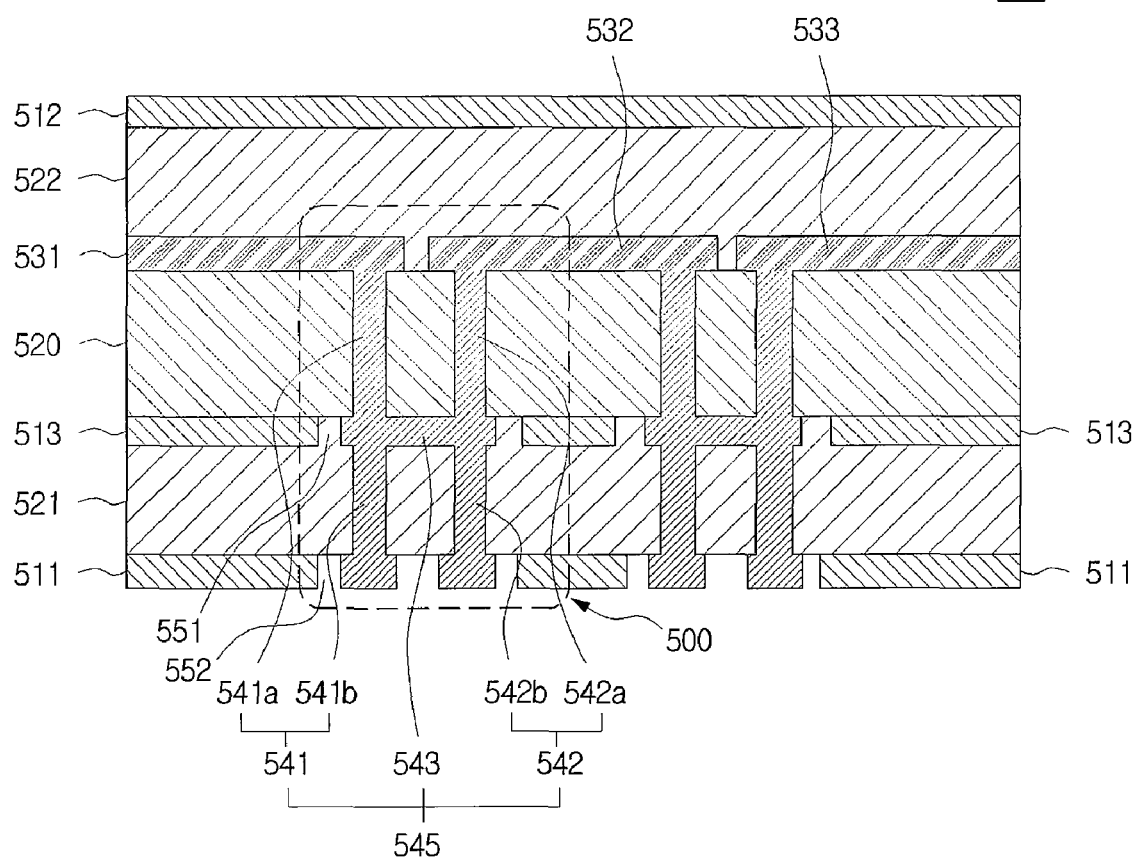
FIG. 5 is a sectional view showing an electromagnetic bandgap structure including a stitching via and a printed circuit board having the same in accordance with a first embodiment of the present invention.
Figure 6:
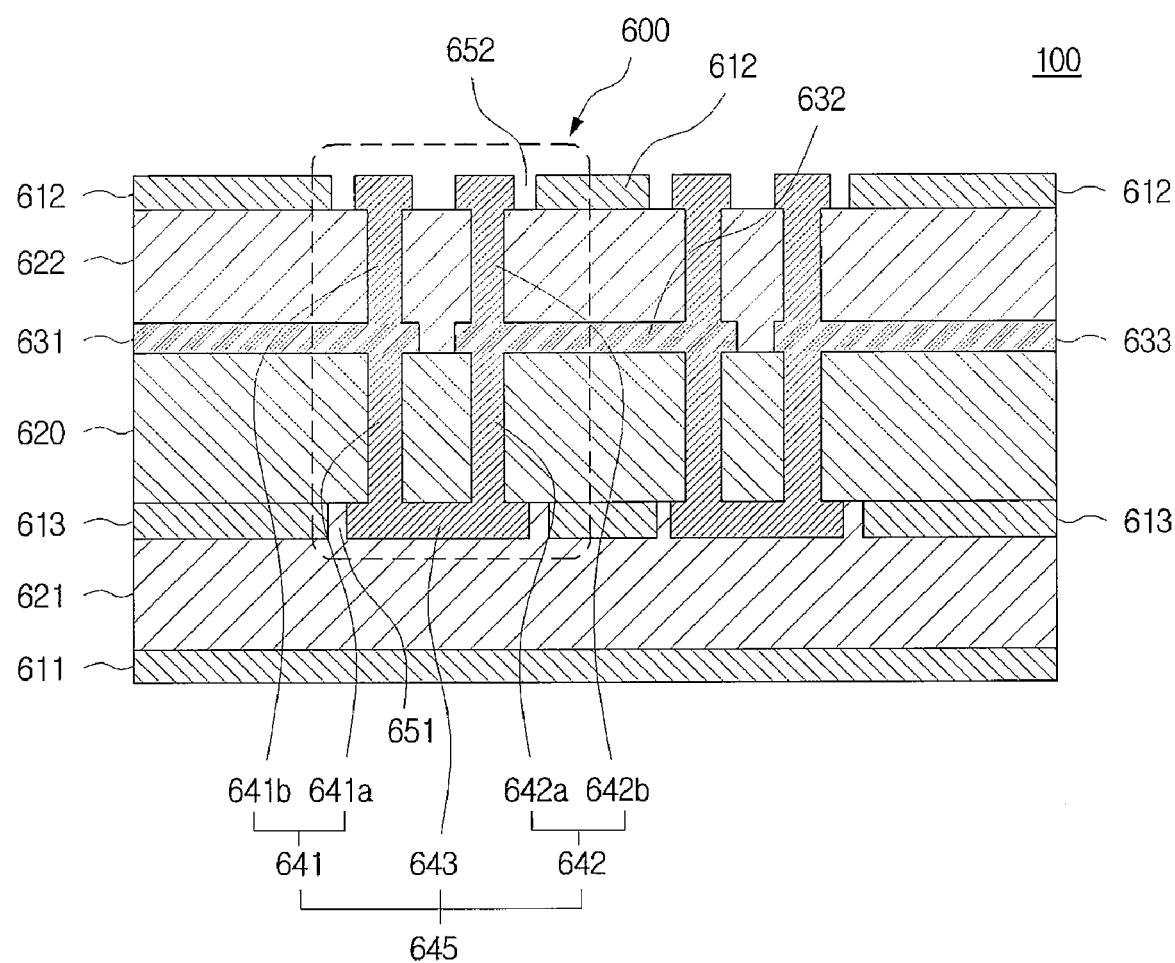
FIG. 6 is a sectional view showing an electromagnetic bandgap structure including a stitching via and a printed circuit board having the same in accordance with a second embodiment of the present invention.
Figure 7:
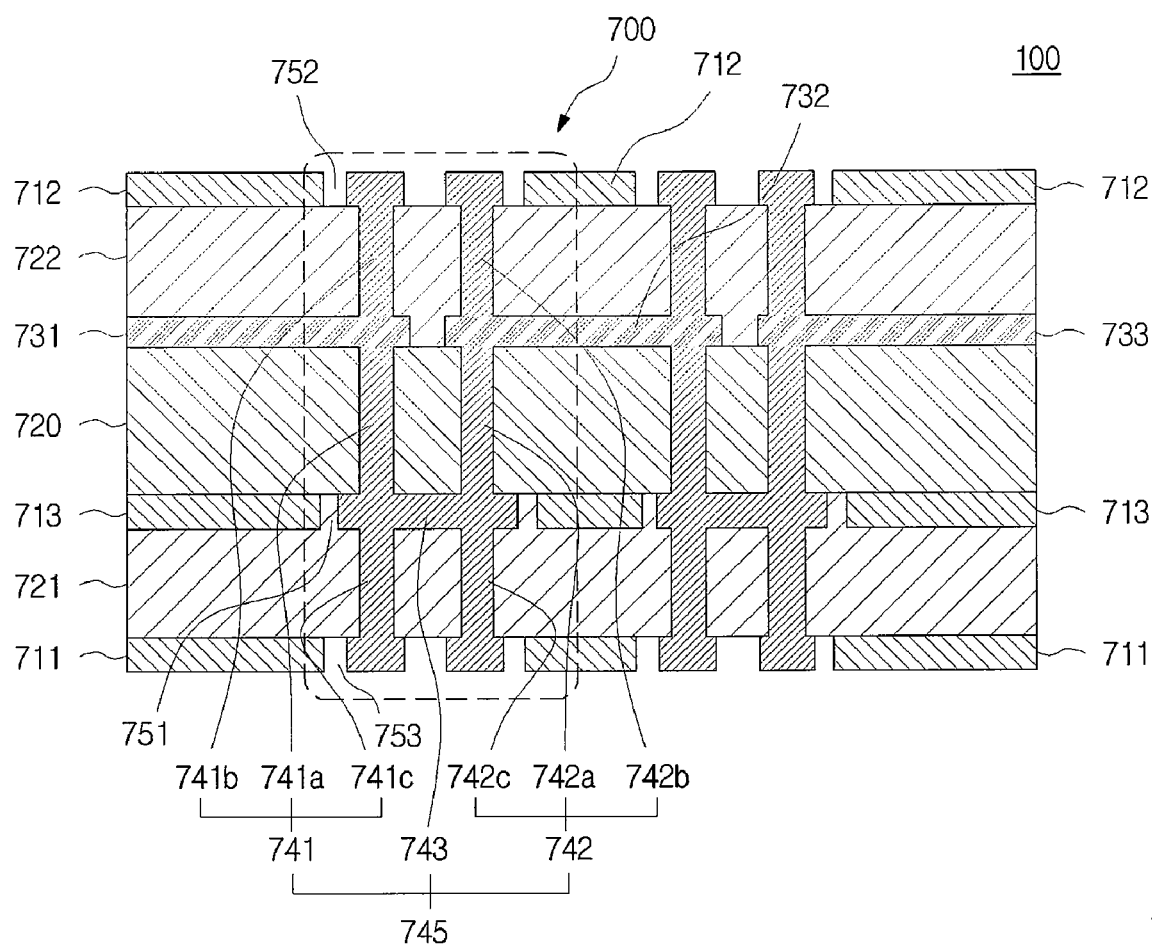
FIG. 7 is a sectional view showing an electromagnetic bandgap structure including a stitching via and a printed circuit board having the same in accordance with a third embodiment of the present invention.

Hereinafter, an electromagnetic bandgap structure having a stitching via will be described as the basic principle of the present invention with reference to FIG. 3A through FIG. 3C for easy understanding of the present invention before each embodiment of the present invention shown in FIG. 5 through FIG. 7 is described in detail.

As seen through the comparison with FIG. 3A through FIG. 3C described below, it is suggested that the electromagnetic bandgap structure of FIG. 5 through FIG. 7 in accordance with each embodiment of the present invention is an electromagnetic bandgap structure having a stitching via that is applicable to a multi-layered (i.e. 3 or more-layered) printed circuit board.

Figure 3A:
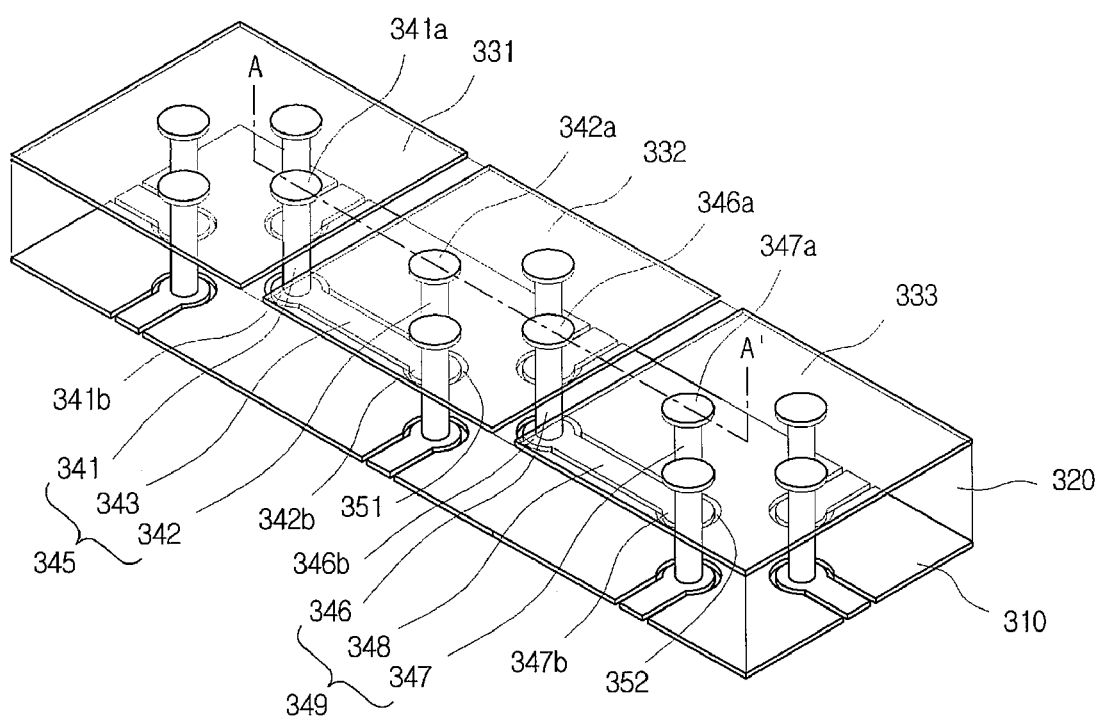
FIG. 3A is a perspective view showing an example of a two-layered electromagnetic bandgap structure having a stitching via.
Figure 3B:
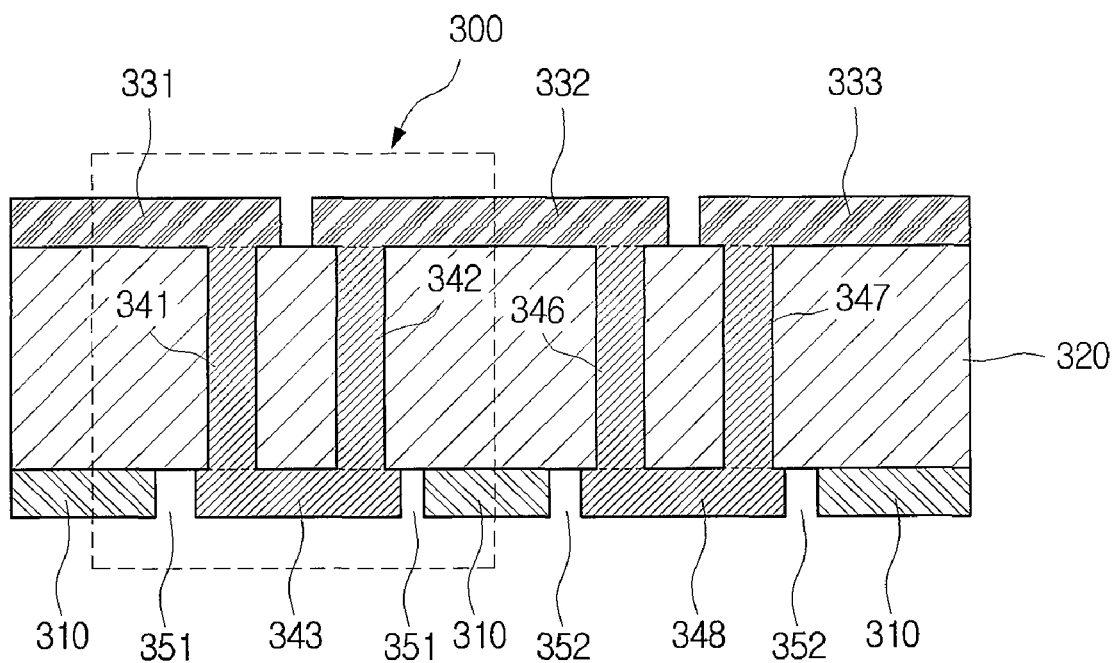
FIG. 3B shows a section viewed along the A-A' line of the two-layered electromagnetic bandgap structure having the stitching via of FIG. 3A.
Figure 3C:
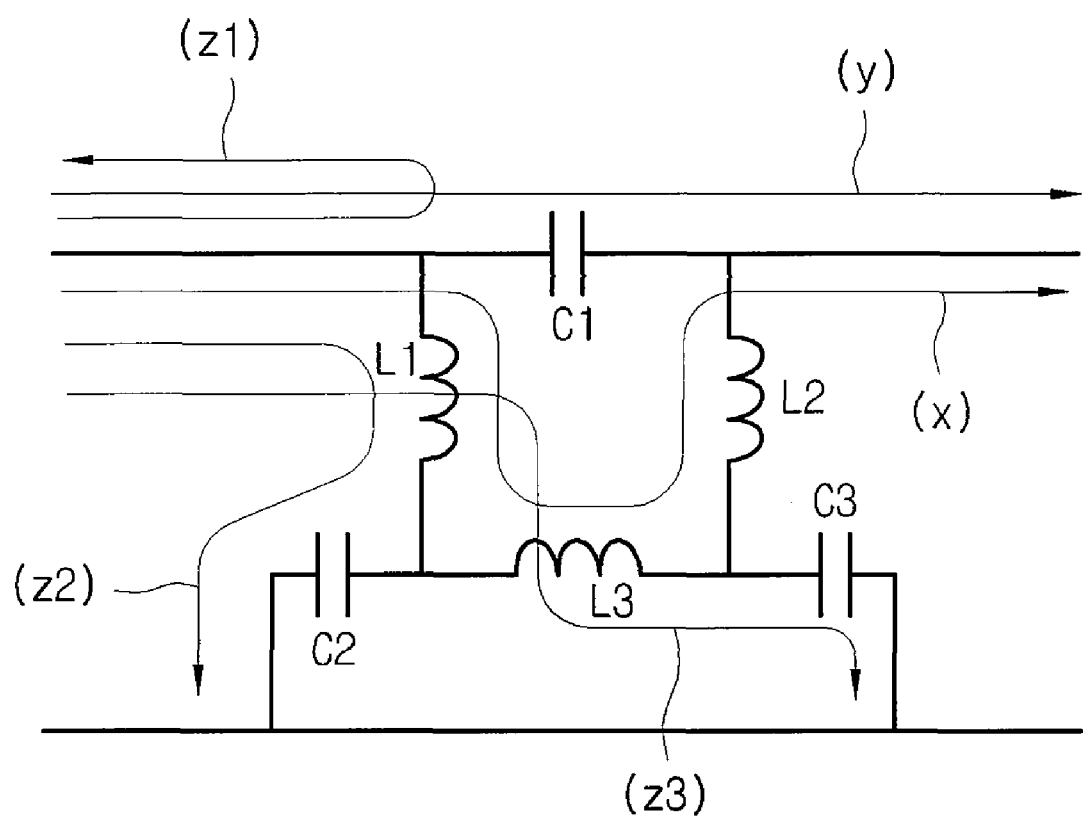
FIG. 3C shows an equivalent circuit of the two-layered electromagnetic bandgap structure having the stitching via of FIG. 3A.

In other words, the electromagnetic bandgap structure in accordance with each embodiment of the present invention can be considered as an extension and/or modification of the two-layered electromagnetic bandgap structure having a stitching via of FIG. 3A through FIG. 3C and the basic principle thereof (i.e. the principle of blocking a particular frequency band) in the form of being more suitable or more flexibly applicable to a multi-layered printed circuit board.

Accordingly, most (except for a two-layered structure) of the description related to FIG. 3A through FIG. 3C and FIG. 4A through 4E, which will be described below, can be equally or similarly applied to each of the embodiments of the present invention.

Although a metal layer and a metal plate are used throughout the description of the structure of an electromagnetic bandgap of the present invention, it shall be evidently understood by any person of ordinary skill in the art that any other conductive layers and plates can be substituted for the metal layer and the metal plate.

Although all of the foresaid drawings show that all metal plates are stacked on the same planar surface, it is not always necessary that all metal plates are stacked on the same planar surface. In case at least one of the metal plates is stacked on a planar surface that is different from the planar surface on which the other metal plates are stacked, the electromagnetic bandgap structure will have two or more layers. However, this increased number of layers may have no disadvantageous effect on the design when the electromagnetic bandgap structure of the present invention is applied to a multi-layered printed circuit board.

FIG. 3A shows the two-layered electromagnetic bandgap structure having the stitching via. FIG. 3B shows a section viewed along the A-A' line of the two-layered electromagnetic bandgap structure having the stitching via of FIG. 3A.

For an easy comparison with the electromagnetic bandgap structure (i.e. the electromagnetic bandgap structure of FIG. 5 through FIG. 7) in accordance with an embodiment of the present invention, the metal layer represented by reference numeral 310 is dubbed a first metal layer 310. Similarly, the metal plates represented by reference numerals 311, 332 and 333, the dielectric layer represented by reference numeral 320 and the stitching vias represented by reference numerals 345 and 349 are dubbed a first metal plate 331, a second metal plate 332, a third metal plate 333, a first dielectric layer 320, a first stitching via 345 and a second stitching via 349, respectively.

In FIG. 3A and FIG. 3B, the electromagnetic bandgap structure can include a plurality of metal plates 331, 332 and 333, a first metal layer 310 placed on a planar surface that is different from the planar surface on which the other metal plates are placed and stitching vias 345 and 349 electrically connecting any two adjacent ones of the plurality of metal plates to each other. The electromagnetic bandgap structure of FIG. 3A and FIG. 3B can have the two-layered structure having a first layer on which the first metal layer 310 is placed and a second layer on which the plurality of metal plates 331, 332 and 333 are placed. A first dielectric layer can be interposed between the first metal layer 310 and the plurality of metal plates 331, 332 and 333.

Here, FIG. 3A and FIG. 3B merely show elements constituting the electromagnetic bandgap structure (i.e. a part constituting the 2-layered electromagnetic bandgap having the stitching via) for the convenience of illustration. Accordingly, the first layer on which the first metal layer 310 is placed and the second layer on which the plurality of metal plates 331, 332 and 333 are placed, shown in FIG. 3A and FIG. 3B, may be any two layers of a multi-layered printed circuit board.

In other words, it shall be obvious that there can be at least one additional metal layer below the first metal layer 310 and/or above the metal plates 331, 332 and 333.

For example, the electromagnetic bandgap structure shown in FIG. 3A and FIG. 3B can be placed between any two metal layers functioning as the power layer and the ground layer, respectively, in a multi-layered printed circuit board in order to block the conductive noise (the same can be applied to electromagnetic bandgap structures shown in FIG. 5 through FIG. 7 in accordance with other embodiments of the present invention).

Since the conductive noise problem is not limited to the space between the power layer and the ground layer, the electromagnetic bandgap structure shown in FIG. 3A and FIG. 3B and FIG. 5 though FIG. 7 can be placed between any two ground layers or power layers placed on different layers from each other in a multi-layered printed circuit board.

Accordingly, the first metal layer 310 may be any metal layer for transferring an electric signal in a printed circuit board. The first metal layer 310, for example, can be any metal layer functioning as the power layer or the ground layer or any metal layer functioning as a signal layer constituting a signal line.

The first metal layer 310 can be placed on a planar surface different from the planar surface in which the plurality of metal plates are placed and electrically separated from the plurality of metal plates 331, 332 and 333. In other words, the first metal layer 310 can form a layer that is different from the plurality of metal plates 331, 332 and 333 in regard to electrical signals in the printed circuit board.

For example, if the first metal layer 310 is the power layer, the metal plates can be electrically connected to the ground layer. If the first metal layer 310 is the ground layer, the metal plates can be electrically connected to the power layer. Alternatively, if the first metal layer 310 is the signal layer, the metal plates can be electrically connected to the ground layer. If the first metal layer 310 is the ground layer, the metal plates can be electrically connected to the signal layer.

The plurality of metal plates 331, 332 and 333 can be placed on a planar surface above the metal layer 310. Any two metal plates can be electrically connected to each other through a stitching via. As such, each stitching via electrically connecting any two metal plates to each other can electrically connect every metal plate as one circuit.

Here, FIG. 3A shows the form (i.e. the form of FIG. 4A) that a metal plate and its adjacent metal plates can be electrically connected to each other through each one stitching via, and as a result, every metal plate can be electrically connected to each other. However, as long as all metal plates can be formed as a closed loop by being electrically connected to each other, it can be possible to use any method of connecting the metal plates to each other through the stitching via.

Even though FIG. 3A and FIG. 3B also show only three metal plates having square shapes of the same size for the convenience of illustration, various other modifications can be possible. This will be briefly described with reference to FIG. 4A through FIG. 4E.

Figure 4A:
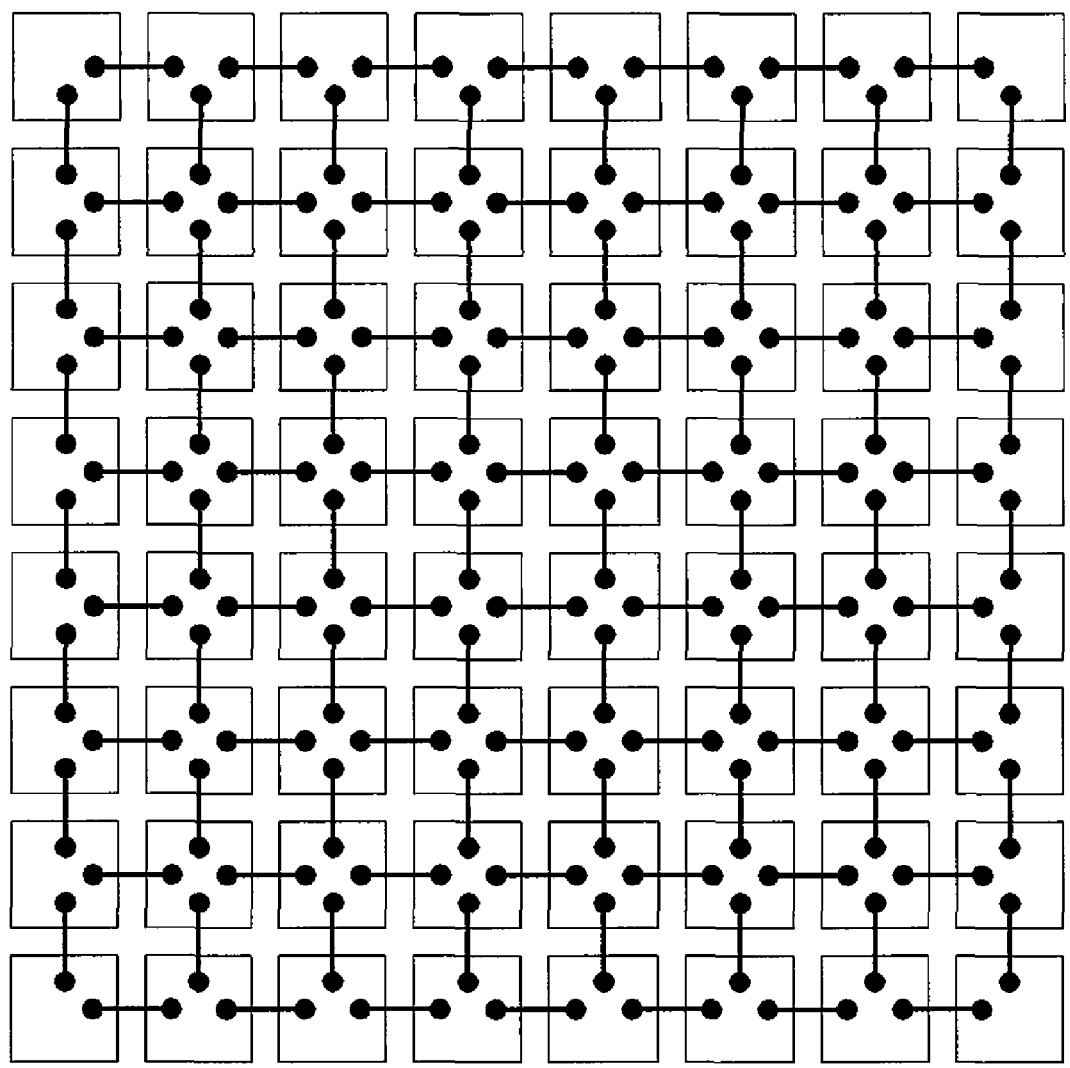
FIG. 4A is a plan view showing a configuration of an electromagnetic bandgap structure including a stitching via having a rectangular metal plate.
Figure 4B:
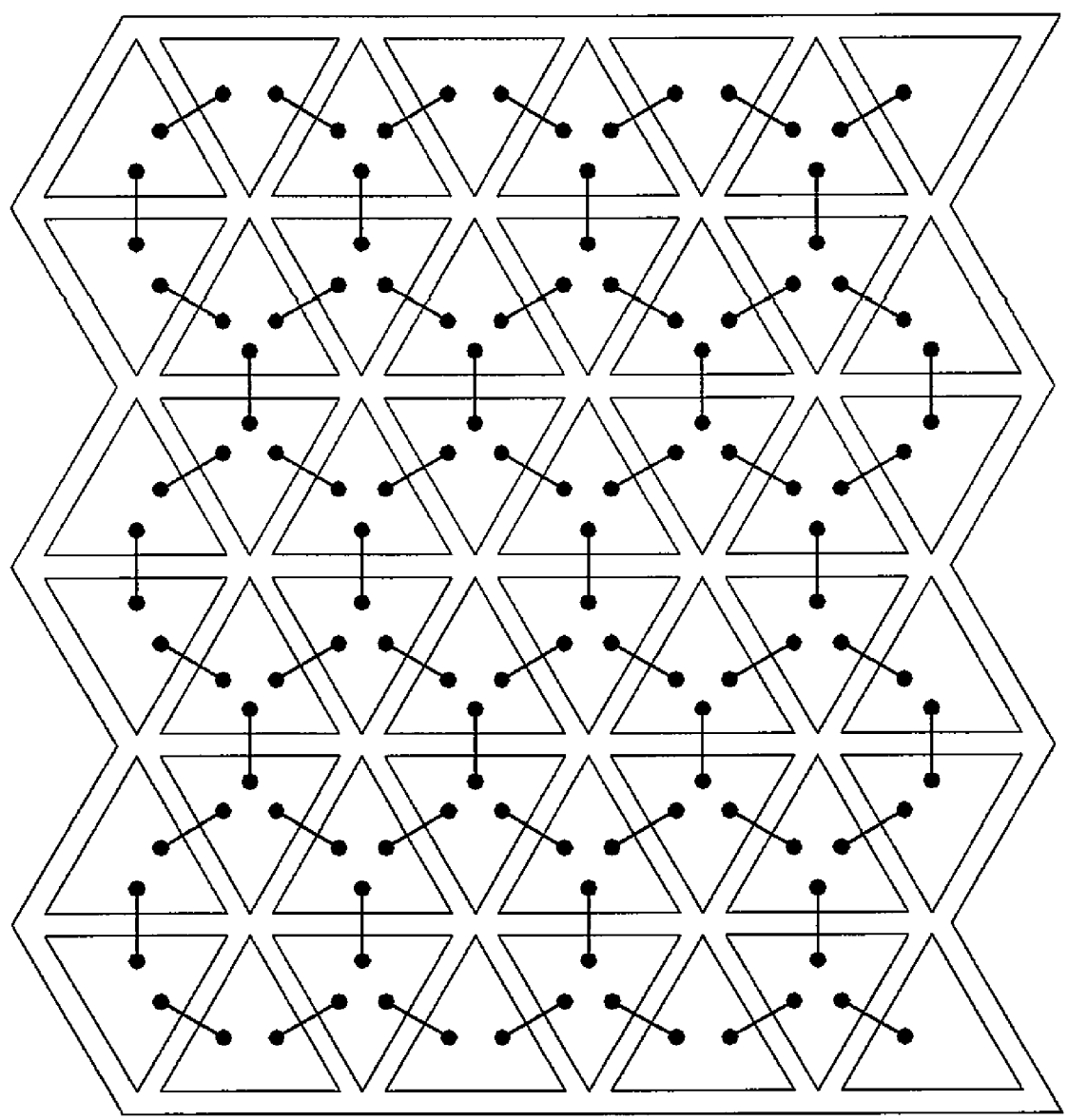
FIG. 4B is a plan view showing a configuration of an electromagnetic bandgap structure including a stitching via having a triangular metal plate.

For example, the metal plates can have various polygonal shapes including not only a rectangle as shown in FIG. 4A, and a triangle, as shown in FIG. 4B, but also a hexagon and an octagon. Of course, the metal plate may not be limited to a certain shape such as a circle or an ellipse. Each of the metal plates can also have the same size (e.g. area and thickness) as shown in FIG. 4A, FIG. 4B and FIG. 4E. If the metal plates have different sizes, the metal plates can be distinguished and disposed according to each of a plurality of groups having different sizes as shown in FIG. 4C or FIG. 4D.

Figure 4C:
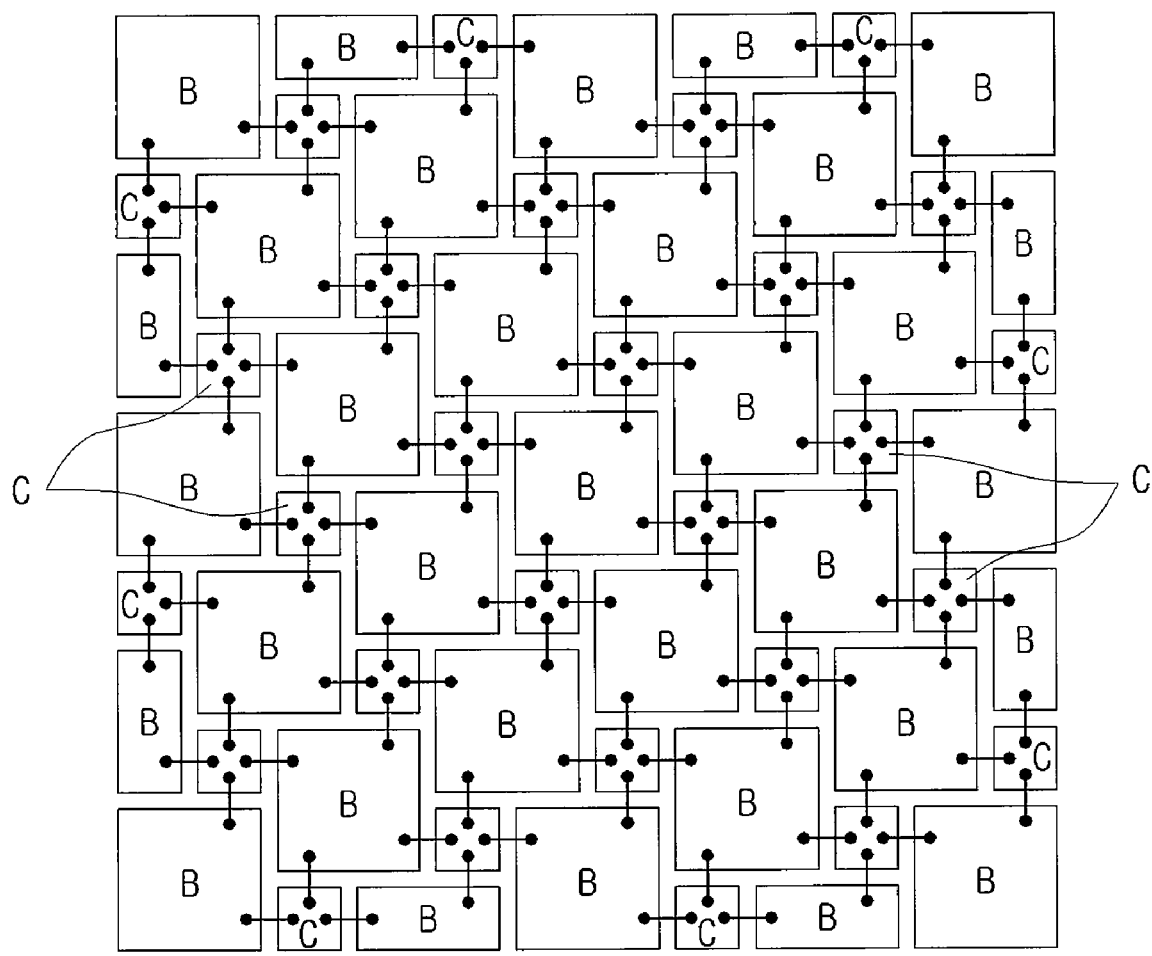
FIG. 4C and FIG. 4D are plan views showing a configuration of an electromagnetic bandgap structure including a stitching via having a plurality of groups having different-sized metal plates.

In the case of FIG. 4C, metal plates B having a relatively bigger size and metal plates C having a relatively smaller size can be alternately arranged, and each metal plate can be electrically connected to its adjacent metal plates through the stitching vias.

Figure 4D:
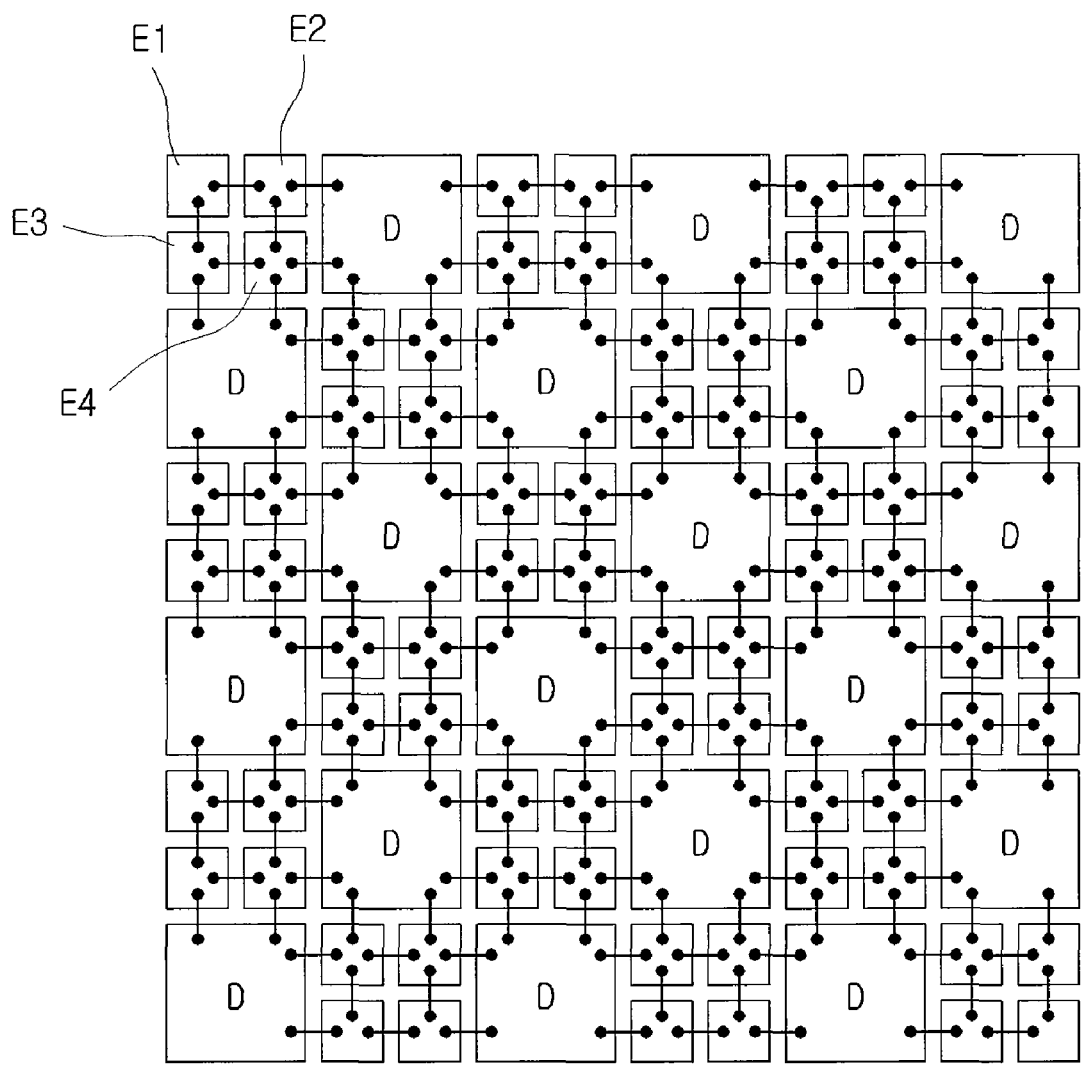
Figure 4E:
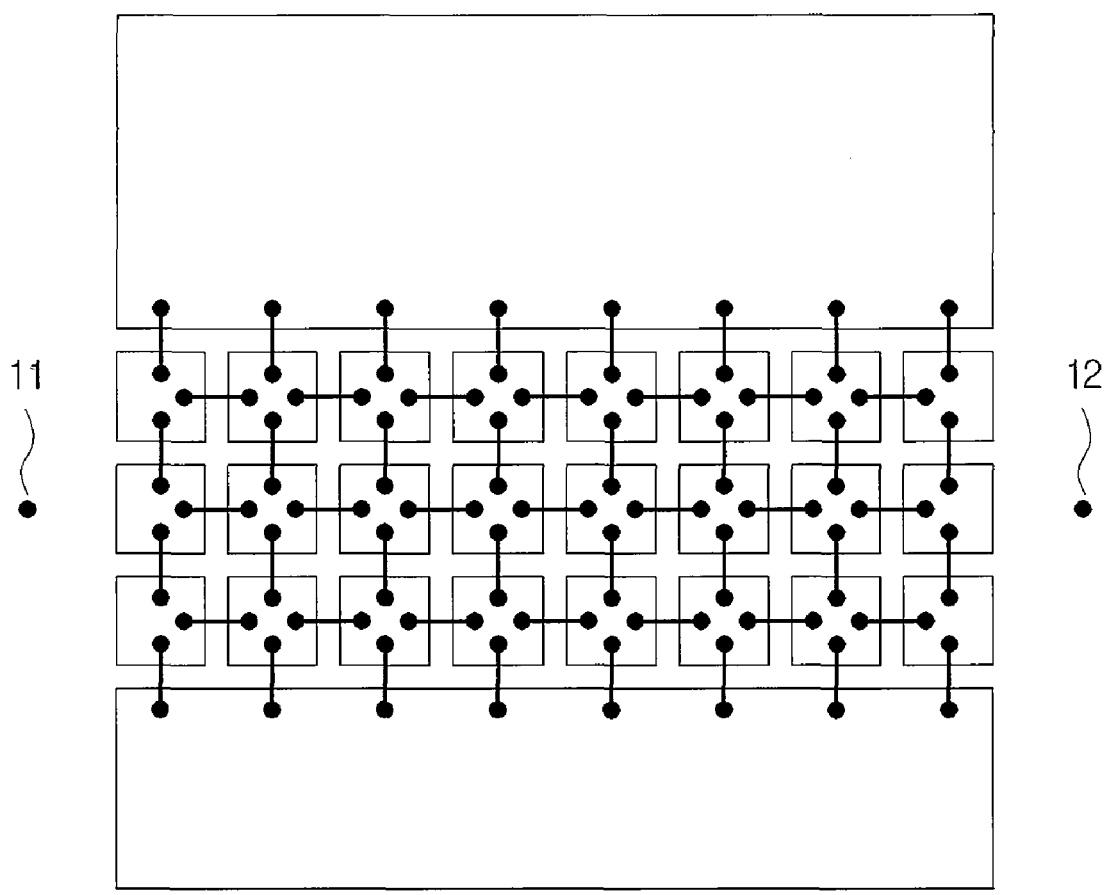
FIG. 4E is a plan view showing a band-shaped configuration of an electromagnetic bandgap structure including a stitching via.

In the case of FIG. 4D, metal plates D having a relatively bigger size and metal plates E1, E2, E3 and E4 having a relatively smaller size can be arranged. The small metal plates E1, E2, E3 and E4 can be grouped in a 2×2 form. Each group consisting of the 4 small metal plates E1, E2, E3 and E4 can occupy the area similar to the large metal plate D. The small metal plates E1, E2, E3 and E4 can be electrically connected to corresponding adjacent metal plates through 4 stitching vias. Moreover, since there are 8 small metal plates around the large metal plate D, the large metal plate D can be electrically connected to its adjacent small metal plates through 8 stitching vias.

Since FIG. 4A through FIG. 4E show each of the electromagnetic bandgap structures arranged in the printed circuit board when viewed from an upper surface, each one metal plate can correspond to each cell of the electromagnetic bandgap structure.

In particular, FIG. 4A through FIG. D show the case that the electromagnetic bandgap structures are repeatedly arranged on the whole part of an inner surface of the printed circuit board. FIG. 4E shows the case that the electromagnetic bandgap structures are arranged on a part of an inner surface of the printed circuit board.

Briefly, while the cells of the electromagnetic bandgap structures can be densely arranged on the whole part of an inner surface of the printed circuit board as shown in FIG. 4A through FIG. 4D, the cells can be arranged on some paths as shown in FIG. 4E.

For example, as shown in FIG. 4E, if it is assumed that a point 11 refers to a noise source point and a point 12 refers to a noise blocking destination point, the cells can be repeatedly arranged in at least one line along a noise transferable path between the noise source point 11 and the noise blocking destination point 12. Alternatively, as shown in FIG. 4E, if it is assumed that a point 21 refers to the noise source point and a point 22 refers to the noise blocking destination point, the cells can be arranged in at least one line to have the shape crossing and blocking a noise transferable path between the noise source point 21 and the noise blocking destination point 22 (i.e. the shape of being shielded by a blocking shield).

Here, if it is assumed that any two electronic circuits (in particular, two digital circuits) having different operation frequencies (refer to the first electronic circuit 130 and the second electronic circuit 140 in FIG. 1, described above) are implemented in the printed circuit board, the noise resource point and the noise blocking destination point can correspond to each position in which the two electronic circuits are to be implemented.

A stitching via can electrically connect any two of a plurality of metal plates to each other. FIG. 3A and FIG. 3B and FIG. 4A through FIG. 4E show that the stitching via electrically connects two adjacent metal plates to each other. However, it may be unnecessary that any two metal plates connected by the stitching via are adjacent to each other.

Even though FIG. 3A also shows that one metal plate is connected to another metal plate by one stitching via, it is obviously unnecessary that the electromagnetic bandgap structure has any limitation to the number of the stitching vias connecting any two metal plates to each other.

However, all things that will be described below are based on the case that two adjacent metal plates are connected to each other by one stitching via.

When electrically connecting any two metal plates to each other, the stitching via can electrically connect the two metal plates not on the same layer in which the metal plates are placed but through a planar surface that is different from a planar surface in which the metal plates are placed.

It shall be evident here that, in order to allow the metal plates to be electrically connected to each other, it is necessary that a plating layer be formed on an inner wall only of the first via and the second via of the stitching via or the inside of the stitching via be filled with a conductive material (e.g. a conductive paste), and the connection pattern be a conductive material such as a metal.

The first stitching via 345 can electrically connect the first metal plate 331 to the second metal plate 332 in the order of the first metal plate 331→the first via 341→a connection pattern 343 placed on the same planar surface as the first metal layer 310→the second via 342→the second metal plate 332.

Similarly, the second stitching via 349 can electrically connect the second metal plate 332 to the third metal plate 333 in the order of the second metal plate 332→a first via 346→a connection pattern 348 placed on the same planar surface as the first metal layer 310→a second via 347→the third metal plate 333.

Herein, the first stitching via 345 can be formed to include a first via 341 formed to have one end part 341a connected to the first metal plate 331 and penetrate the first dielectric layer 320, a second via 342 formed to have one end part 342a connected to the second metal plate 332 and penetrate the first dielectric layer 320 and a connection pattern 343 placed to have one end part connected to the other end part 341b of the first via 341 and the other end part connected to the other end part 342b of the second via 342 and to be connected through a same planar surface as the first metal layer 310.

Similarly, the second stitching via 349 can be formed to include a first via 346 formed to have one end part 346a connected to the second metal plate 332 and penetrate the first dielectric layer 320, a second via 347 formed to have one end part 347a connected to the third metal plate 333 and penetrate the first dielectric layer 320 and a connection pattern 343 placed to have one end part connected to the other end part 346b of the first via 346 and the other end part connected to the other end part 347b of the second via 347 and to be connected through a same planar surface as the first metal layer 310.

As a result, the stitching via 345 and the second via 349 can be designed to have each predetermined part (e.g. the connection patterns 343 and 348) to be connected through a planar surface (e.g. the first metal plate 310) that is different from a planar surface on which the metal plates are placed in order to electrically connect the first metal plate 331 to the second metal plate 332 and the second metal plate 332 to the third metal plate 333, respectively.

At this time, a via land can be formed in one end part and the other end part of each of the vias 341 and 342, and 346 and 347 that forms the first stitching via 345 and the second stitching via 349, respectively. The via land can be formed to have a longer diameter than the via in order to reduce a position error of a drilling process for forming the via. FIG. 3A shows that one end part and the other end part of each via have a larger size than the via.

Moreover, the connection pattern 343 of the first stitching via 345 and the connection pattern 348 of the second stitching via 349 can be accommodated in clearance holes 351 and 352, respectively, formed on the first metal layer 310. This is because the first metal layer 310 may form a layer that is different from the metal plates in regard to electrical signals. As a result, each of the connection patterns 343 and 348 of the stitching via can be accommodated in clearance holes 351 and 352 formed on the first metal layer 310 to electrically disconnect the first metal layer 310 from the metal plates that are electrically connected to each other through the stitching via.

As described above, in the two-layered electromagnetic bandgap structure having the stitching via, one of any two metal plates 331 and 332 can be electrically connected to the other metal plate in series in the order of any one metal plate 331→the stitching via 345 (i.e. the first via 341→the connection pattern 343→the second via 342)→the other metal plate 332 based on any one dotted-line cell 300 in FIG. 3B. FIG. 3C shows an equivalent circuit of an electromagnetic bandgap structure having the above structure.

Comparing the equivalent circuit of FIG. 3C with the dotted-line cell 300 in FIG. 3B, an inductance component L1 can correspond to the first via 341, and an inductance component L2 can correspond to the second via 342. An inductance component L3 can correspond to the connection pattern 343. C1 can be a capacitance component caused by the metal plates 331 and 332 and another dielectric layer and another metal layer to be placed above the metal plates 331 and 332. C2 and C3 can be capacitance components caused by the first metal layer 310 placed in the same planar surface as the connection pattern 343 and another dielectric layer and another metal layer to be placed below the first metal layer 310.

The electromagnetic bandgap structure shown in FIG. 3A and FIG. 3B can function as a band stop filter, which blocks a signal of a certain frequency band, according to the above equivalent circuit. In other words, as seen in the equivalent circuit of FIG. 3C, a signal of a low frequency band (refer to x of FIG. 3C) and a signal of a high frequency band (refer to y of FIG. 3C) can pass through the electromagnetic bandgap structure, and signals of a certain frequency band (refer to z1, z2 and z3 of FIG. 3C) ranging between the low frequency band and the high frequency band are blocked by the electromagnetic bandgap structure.

It shall be noted here that the electromagnetic bandgap structure shown in FIGS. 3A and 3B has a two-layered structure including a stitching via and thus a wider, more various bandgap frequency band is possible due to a plurality of blocked paths (refer to z1, z2 and z3 of FIG. 3C) caused by 3 inductance components and 3 capacitance components. However, the aforementioned mushroom type electromagnetic bandgap structure of FIG. 2A and FIG. 2B has a simple blocked path (i.e. a simple path caused by one inductance component and one capacitance component), thereby having a very limited and narrow bandgap frequency band.

Figure 2A:
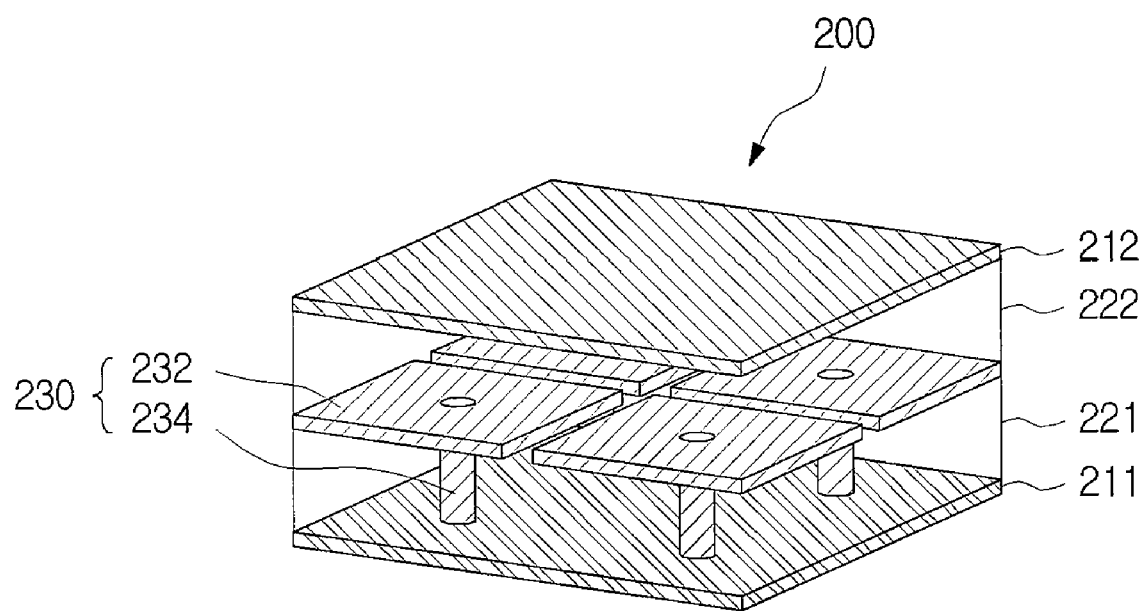
FIG. 2A and FIG. 2B are perspective views showing an electromagnetic bandgap structure having a mushroom type structure.
Figure 2B:
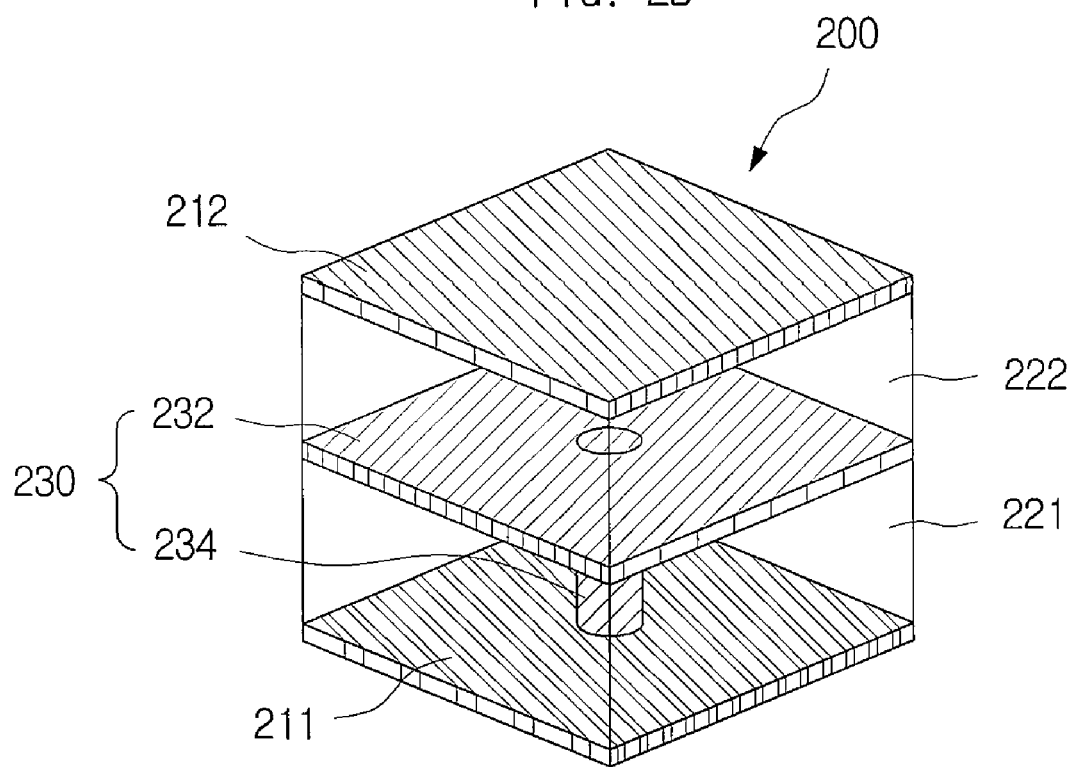
Figure 2D:
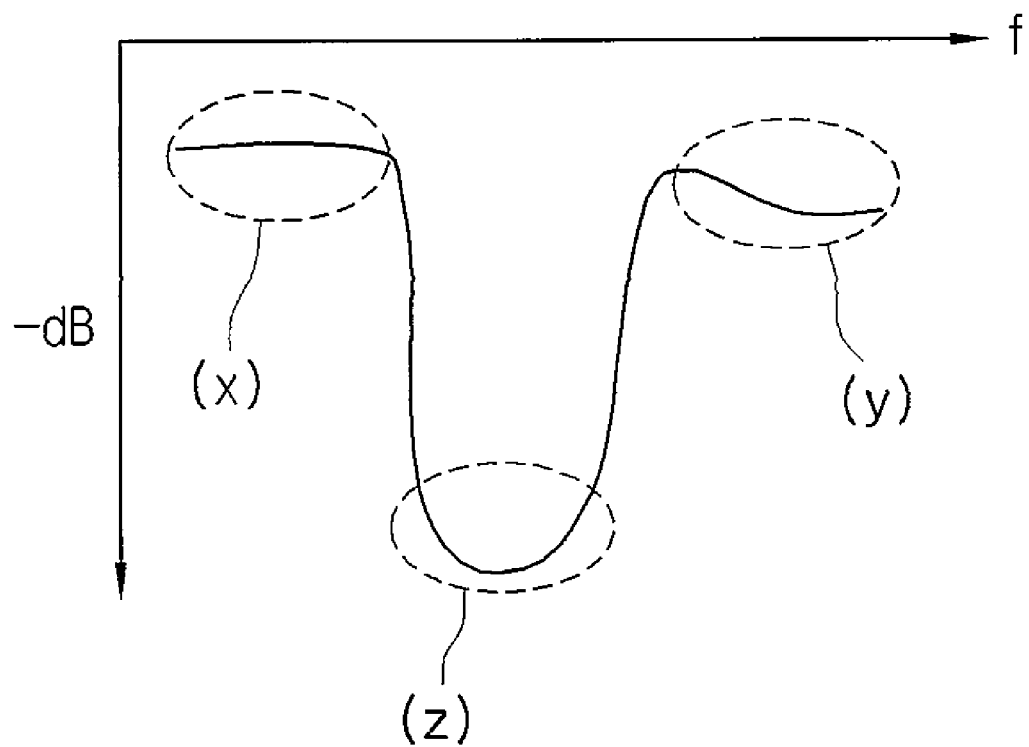
FIG. 2D is a graph showing a frequency property of the electromagnetic bandgap structure of FIG. 2B.

As such, the equivalent circuit of FIG. 3C obviously proves that the two-layered electromagnetic bandgap structure including the stitching via of FIG. 3A and FIG. 3B has the wider blocking range and better blocking efficiency than the mushroom type electromagnetic bandgap structure of FIG. 2A and FIG. 2B.

The electromagnetic bandgap structure having the stitching via can acquire a length of the via enough as compared with the mushroom type electromagnetic bandgap structure because adjacent metal plates are electrically connected to each other through the stitching via to be connected through a planar surface that is different from that of the metal plates. At this time, the acquirable length of the stitching via can be in proportion to an inductance value that can be acquired soon. Accordingly, it can be possible to adjust the inductance value enough in the electromagnetic bandgap structure.

In addition, since the adjacent metal plates are electrically connected to each other through the stitching via to be connected through a planar surface that is different from that of the metal plates, it may be unnecessary that a pattern for connecting the metal plates to each other is formed on the same planar surface as the metal plates. This can make spaced gaps between the metal plates narrower. The narrower spaced gaps between the metal plates can cause a capacitance value of the gap to rise proportionally. Accordingly, it can be possible to adjust the capacitance value enough in the electromagnetic bandgap structure.

In the equivalent circuit of FIG. 3, the value of each capacitance component can be varied according to various factors such as a spaced gap between the metal plate and the metal layer, a spaced gap between adjacent metal plates, a dielectric constant of a dielectric material forming a dielectric layer interposed between the metal layers or the metal layer and the metal plate and the size, shape and area of the metal plate. The value of the inductance component can be also varied according to various factors such as the shape, length, diameter, thickness and width of each via and the connection pattern forming the stitching via.

Accordingly, adjusting and designing various aforementioned factors adequately can make it possible to allow the structure of FIG. 3A and FIG. 3B to universally function as the electromagnetic bandgap structure (i.e. a band stop filter) for removing or blocking a certain noise or a certain signal of an object frequency band.

Accordingly, if the structure of FIG. 3A and FIG. 3B is repeatedly arranged on a whole part (refer to FIG. 4A through FIG. 4D) or a part (refer to FIG. 4E) of an inner surface of the printed circuit board (the same can be applied to the structure of FIG. 5 through FIG. 7, described below) as a noise transferable path, it is possible to function as the electromagnetic bandgap structure that can prevent a signal of a certain frequency band from being transferred.

The electromagnetic bandgap structure including the stitching via, which has the two-layered structure including an upper layer in which the plurality of metal plates 331, 332 and 333 are placed, a lower layer in which the first metal layer 310 is placed and the first dielectric layer 320 placed therebetween, has been described above with reference to FIG. 3A and FIG. 3B.

However, it may be unnecessary that the electromagnetic bandgap structure having the stitching via has the same shape and structure as shown in FIG. 3A and FIG. 3B.

For example, it may be unnecessary that the electromagnetic bandgap structure having a stitching via include a metal layer (refer to 310 of FIG. 3A and FIG. 3B), placed below an area in which there is the stitching via and the metal layers. This may be because it is not always necessary that the connection pattern of the stitching via be formed on a space in which there is the metal layer.

In other words, if there is a metal layer on the same planar surface to correspond to an area on which the connection pattern is to be formed, the connection pattern can be manufactured in the form of being accommodated in the clearance hale (refer to 351 and 352 of FIG. 3A and FIG. 3B) formed in the metal layer (refer to 310 of FIG. 3A and FIG. 3B) on the same planar surface. However, no additional metal layer may be placed in the area in which the connection pattern is to be formed (refer to FIG. 8B described below).

Moreover, it may not be always necessary that the 2-layered electromagnetic bandgap structure including the stitching via is formed to have the same stacked structural shape as shown in FIG. 3A and FIG. 3B. In other words, the 2-layered electromagnetic bandgap structure having the stitching via can be formed to have another structural shape including a lower layer in which the metal plates are placed, an upper layer in which the metal layer is placed, the dielectric layer interposed between the lower layer and the upper layer and the stitching via, penetrating the dielectric layer (i.e. a structural shape, with the position of the upper layer and the lower layer inversed from that of FIG. 3A and FIG. 3B.).

Of course, the identical or similar noise blocking effect can be expected.

Hereinafter, each embodiment of an electromagnetic bandgap structure and a printed circuit board having the same will be described in turn with reference to FIG. 5 through FIG. 7. However, any matter already described in FIG. 3A through FIG. 4E will be not redundantly described, and the electromagnetic bandgap structure and the printed circuit board including the same will be described based on the features of each embodiment of the present invention.

This is, as described above, because all technical idea/principle can be equally applied to each of the embodiments of the present invention of FIG. 5 through FIG. 7 except that the electromagnetic bandgap structure having the stitching via employs the two-layered structure of FIG. 3A and FIG. 3B.

For the convenience of illustration, it shall be noted that FIG. 5 through FIG. 7 are sectional views showing some metal layers directly related to an area in which the electromagnetic bandgap structure of the present invention is placed among a plurality of metal layers of a multi-layered printed circuit board (refer to the reference numeral 100 of FIG. 5 through FIG. 7). Accordingly, it shall be obvious that at least another metal layer can be placed above a top layer and/or below a bottom layer in FIG. 5 through FIG. 7. Of course, at least yet another metal layer can be obviously placed between metal layers and/or between a metal layer and metal plates.

For the convenience of illustration and understanding of the invention, in FIG. 5 through FIG. 7, only three metal plates are shown, and one metal plate is electrically connected to another adjacent metal plate and yet another adjacent metal plate through one stitching via each (i.e. two adjacent cells around one cell are connected to each other).

In other words, the electromagnetic bandgap structure in accordance with each embodiment of the present invention, as described already with reference to FIG. 4A through FIG. 4E, can be arranged to have various shapes, sizes and configurations in some or all parts of the board. This can be clearly understood by any person of ordinary skill in the art through the overall intent of the present invention.

Accordingly, the electromagnetic bandgap structure according to each embodiment of the present invention will be described below based on an area (i.e. a dotted-line area 500, 600 or 700 in FIG. 5 through FIG. 7) in which any two of a plurality of metal plates are electrically connected to each other through a stitching via.

FIG. 5 is a sectional view showing an electromagnetic bandgap structure including a stitching via and a printed circuit board having the same in accordance with a first embodiment of the present invention.

The electromagnetic bandgap structure in accordance with the first embodiment of the present invention can include a plurality of metal plates placed on a planar surface between two metal layers and stitching vias electrically connecting any two of the metal plates to each other.

For the convenience of describing the drawings and for an easy comparison with the electromagnetic bandgap structure in FIG. 3A and FIG. 3B, a metal layer represented by reference numeral 511 is dubbed a first metal layer 511. Similarly, metal layers represented by reference numerals 512 and 513, metal plates represented by reference numerals 531, 532 and 533, and dielectric layers represented by reference numerals 520, 521 and 522 are dubbed a second metal layer 512 and a third metal layer 513, a first metal plate 531, a second metal plate 532 and a third metal plate 533, and a first dielectric layer 520, a second dielectric layer 521 and a third dielectric layer 522, respectively. However, it is not necessary that the layers represented by reference numerals 521 and 522 be dielectric layers.

As shown in FIG. 5, the first metal plate 531, the second metal plate 532 and the third metal plate 533 can be placed on a planar surface between the first metal layer 511 and the second metal layer 512. Each stitching via can make an electrical connection between the first metal plate 531 and the second metal plate 532 and between the second metal plate 532 and the third metal plate 533. This will be described in detail based on a dotted-line area 500 (i.e. an area related to a stitching via 545 that makes an electrical connection between the first metal plate 531 and the second metal plate 532).

In accordance with the first embodiment of the present invention, the stitching via 545 can include a first via 541 extending from the first metal plate 531 to a planar surface in which the first metal layer 511 is placed, a second via 542 extending from the second metal plate 532 to the planar surface in which the first metal layer 511 is placed and a connection pattern 543 electrically connecting the first via 541 to the second via 542. The connection pattern 543 can be placed on a planar surface that is different from the planar surface in which the metal plates 531, 532 and 533 are placed, between the first metal layer 511 and the second metal layer 512.

As described above, if there is a metal layer (refer to the third metal layer 513 in FIG. 5) on a same planar surface to correspond to an area in which the connection pattern 543 is to be formed, the connection pattern 543 can be accommodated in a clearance hale (refer to a reference numeral 551 of FIG. 5) formed in a metal layer on the same planar surface. Of course, no additional metal layer may be placed in the area in which the connection pattern 543 is to be formed. In this case, it may be obviously unnecessary that a clearance hole is additionally formed.

Moreover, the stitching via 545 according to the first embodiment of the present invention can further include some areas (refer to reference numerals 541*b* and 542*b* of FIG. 5) that extends from the connection pattern downwards to the planar surface in which the first metal layer 511 is placed, in addition to some areas (refer to reference numerals 541*a* and 542*a* of FIG. 5) placed between the metal plate and the connection pattern. This is structurally different from the stitching via of the electromagnetic bandgap structure shown in FIG. 3A and FIG. 3B.

However, although FIG. 5 shows that both of the first via 541 and the second via 542 of the stitching via 545 extend toward the same planar surface as the first metal layer 511, only one of the first via 541 and the second via 542 can extend toward the first metal layer 511 in order to pass through an area on the same planar surface as the first metal layer 511.

At this time, the first via 541 and/or the second via 542 extending from the metal plate to the first metal layer 511 can be a plated through hole (hereinafter, referred to as "PTH"), which penetrates the first metal layer 511, the connection pattern, and the metal plate. If the metal plate forms a layer that is different from the first layer 511 with respect to signals, since it is necessary to electrically disconnect the PTH from the first metal layer 511, a clearance hole (refer to the reference numeral 552 of FIG. 5) may be required to be formed on an area which the PTH penetrates in the first metal layer 511.

Of course, it shall be obvious that the first via 541 and/or the second via 542, extending through the metal plate and the connection pattern toward the same planar surface as the first metal layer 511 can be formed by using a plurality of blind via holes (BVH) or inner via holes (IVH). In the case of the first via 541, for example, an area 541*a* between the first metal plate 531 and the connection pattern 543 can be connected to an area 541*b* between the connection pattern 543 and the same planar surface as the first metal layer 511 by using each additional BVH.

At this time, if an electrical connection is assumed to be made between two BVHs, it is not necessary that the BVHs be formed to have the same center axis. When 3 or more layers are connected to each other by using vias, known technologies such as a stack via method, a staggered via method, an o-ring via, and a plated through hole (PTH) method can be typically used. Accordingly, the pertinent detailed description will be omitted.

In the following description, it is assumed that both of the first via 541 and the second via 542 of the stitching via 545 are the PTHs.

It is assumed that the first via 541 and the second via 542 of the stitching via 545 are formed by using the BVH or the IVH. When the electromagnetic band gap structure having the stitching via according to the first embodiment of the present invention is formed in an inner layer of a multi-layered printed circuit board, the processes of forming the BVH or the IVH at each of the areas between the metal plate and the connection pattern and between the connection pattern and the same planar surface as the first metal layer 511 may be required to be added, in addition to the process of stacking the metal plate, the connection pattern, and the first metal layer 511. This may cause the number of the stacking process to be increased.

In order to acquire an inductance component caused by the vias, the first via 541 and/or the second via 542 can be formed to extend through more layers. In this case, the present invention may not have a single metal plate but have a plurality of stitching vias for electrically connecting the metal plates to each other. This may cause the number of the stacking process to be greatly increased.

Accordingly, when an electromagnetic bandgap structure having a stitching via according to each embodiment of the present invention is applied to the inner layer of the multi-layered printed circuit board, it is possibly inadequate to form a first via and a second via of the stitching via by using the BVH or the IVH in view of the entire PCB manufacturing process.

The aforementioned problem can be solved by replacing the first via and the second via of the stitching via with the PTHs. If the present invention uses the PTH, which has already been included to make an electrical connection between layers, as the first via and/or the second via of the stitching via in the process of manufacturing a multi-layered PCB, it becomes unnecessary to additionally increase the number of the stacking process and to modify the existing PCB manufacturing process in order to apply the electromagnetic bandgap structure of the present invention to the multi-layered printed circuit board.

This can be realized by arranging the electromagnetic bandgap structure such that the first via and/or the second via of each stitching via is replaced corresponding to an area in which the PHT is to be formed in the multi-layered printed circuit board when the multi-layered printed circuit board is designed.

As described above, an electromagnetic bandgap structure having a stitching via according to an embodiment of the present invention can be more adequate and have more flexible design to be applied to a multi-layered printed circuit board, thereby being universally used for various application apparatuses or electronic apparatuses.

Figure 8A:
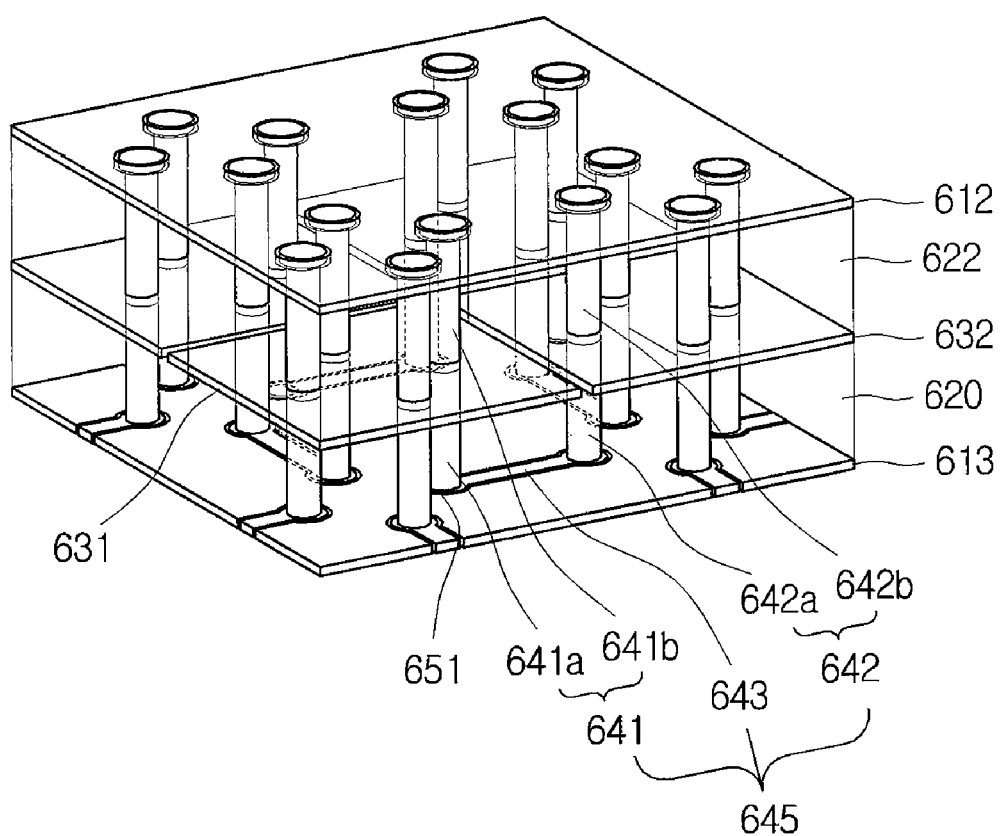
FIG. 8A is a 3-D perspective view showing the electromagnetic bandgap structure of FIG. 6.

FIG. 6 is a sectional view showing an electromagnetic bandgap structure including a stitching via and a printed circuit board having the same in accordance with a second embodiment of the present invention. FIG. 8A is a 3-D perspective view showing the electromagnetic bandgap structure of FIG. 6.

The electromagnetic bandgap structure in accordance with the second embodiment of the present invention can include a plurality of metal plates placed on a planar surface between two metal layers and stitching vias electrically connecting any two of the metal plates to each other.

For the convenience of describing the drawings and for an easy comparison with the electromagnetic bandgap structure in FIG. 3A, FIG. 3B, and FIG. 5, a metal layer represented by reference numeral 611 is dubbed a first metal layer 611. Similarly, metal layers represented by reference numerals 612 and 613, metal plates represented by reference numerals 631, 632 and 633, and dielectric layers represented by reference numerals 620, 621 and 622 are dubbed a second metal layer 612 and a third metal layer 613, a first metal plate 631, a second metal plate 632 and a third metal plate 633, and a first dielectric layer 620, a second dielectric layer 621 and a third dielectric layer 622, respectively. However, it is not necessary that the layers represented by reference numerals 621 and 622 be dielectric layers.

Referring to FIG. 6 and FIG. 8A, the first metal plate 631, the second metal plate 632 and the third metal plate 633 can be placed on a planar surface between the first metal layer 611 and the second metal layer 612. Each stitching via can make an electrical connection between the first metal plate 631 and the second metal plate 632 and between the second metal plate 632 and the third metal plate 633. This will be described in detail based on a dotted-line area 600 (i.e. an area related to a stitching via 645 that makes an electrical connection between the first metal plate 631 and the second metal plate 632).

In accordance with the second embodiment of the present invention, the stitching via 645 can include a first via 641 extending from the first metal plate 631 toward the connection pattern 643 in one direction and a planar surface in which the second metal layer 612 is placed in anther direction, a second via 642 extending from the second metal plate 632 toward the connection pattern 643 in one direction and the planar surface in which the second metal layer 612 is placed in another direction and a connection pattern 643 electrically connecting the first via 641 to the second via 642. The connection pattern 643 can be placed on a planar surface that is different from the planar surface in which the metal plates 631, 632 and 633 are placed, between the first metal layer 611 and the second metal layer 612.

At this time, if there is a metal layer (refer to the third metal layer 613 in FIG. 6 and FIG. 8A) on a same planar surface to correspond to an area in which the connection pattern 643 is to be formed, the connection pattern 643 can be accommodated in a clearance hale (refer to a reference numeral 651 of FIG. 6 and FIG. 8A) formed in a metal layer on the same planar surface. As described above, no additional metal layer may be placed in the area in which the connection pattern 643 is to be formed. In this case, it may be obviously unnecessary that a clearance hole is additionally formed.

Moreover, the stitching via 645 according to the second embodiment of the present invention can further include some areas (refer to reference numerals 641b and 642b of FIG. 6 and FIG. 8A) that extends from the metal plate upwards to a planar surface in which the second metal layer 612 is placed, in addition to some areas (refer to reference numerals 641a and 642a of FIG. 6 and FIG. 8A) placed between the metal plate and the connection pattern. This is structurally different from the stitching via of the electromagnetic bandgap structure shown in FIG. 3A, FIG. 3B, and FIG. 5.

Here, although FIG. 6 and FIG. 8A show that both of the first via 641 and the second via 642 of the stitching via 645 extend toward the same planar surface as the second metal layer 612, only one of the first via 641 and the second via 642 can extend toward the second metal layer 612 in order to pass through an area on the same planar surface as the second metal layer 612.

Similar to the above description related to FIG. 5, even though the first via 641 and/or the second via 642 extending from the metal plate to the connection pattern and the second metal layer 612 is formed by using a plurality of BVHs or IVHs in consideration of the number of the stacking process of the PCB manufacturing process, the first via 641 and/or the second via 642 can be a plated through hole (hereinafter, referred to as "PTH"), which penetrates the second metal layer 612, the connection pattern, and the metal plate.

As also described above, if the metal plate forms a layer that is different from the second metal layer 612 with respect to signals, since it is necessary to electrically disconnect the PTH from the second metal layer 612, a clearance hole (refer to the reference numeral 652 of FIG. 6) may be required to be formed on an area which the PTH penetrates in the second metal layer 612.

Figure 8B:
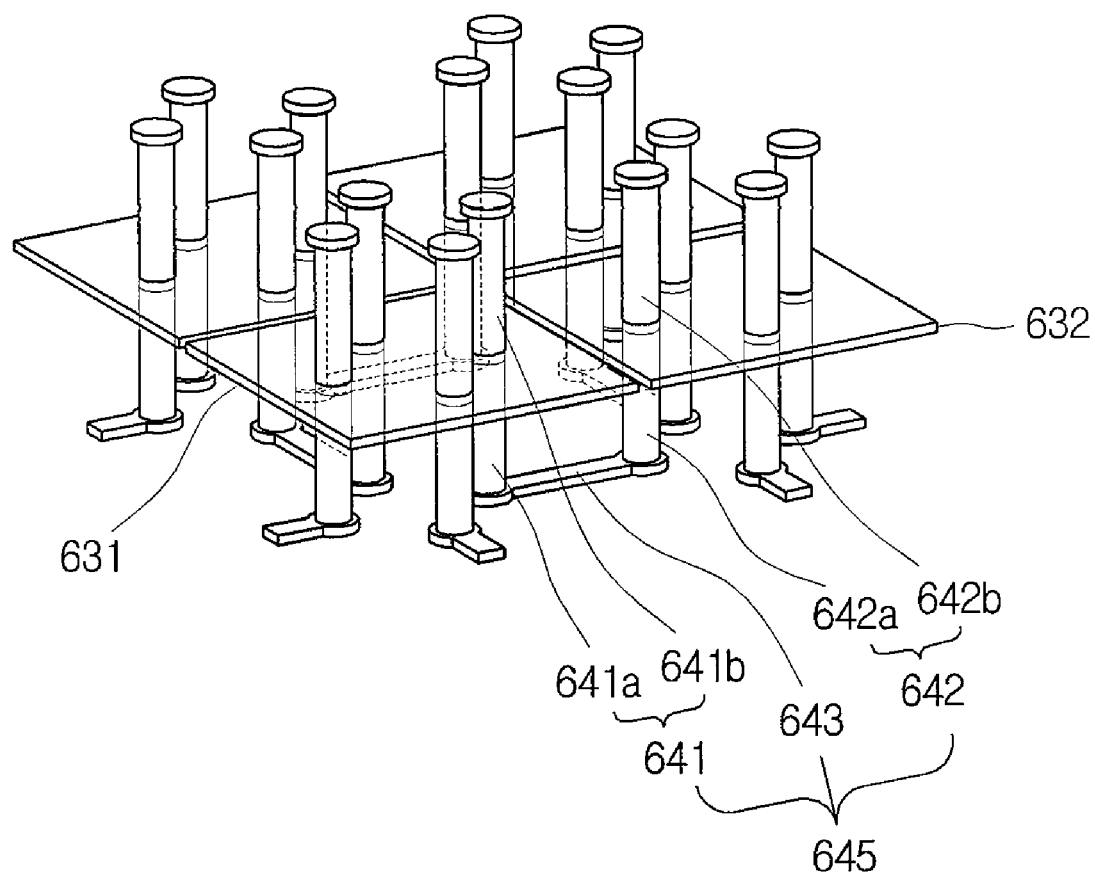
FIG. 8B shows the 3-D perspective view of FIG. 8A without a metal layer.
Figure 9A:
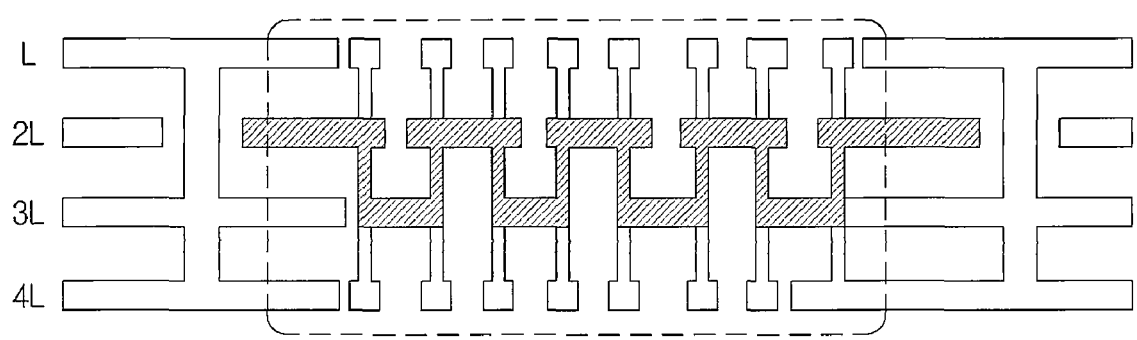
FIG. 9A shows an electromagnetic bandgap structure applied to a four-layered printed circuit board in accordance with an embodiment of the present invention.
Figure 9B:
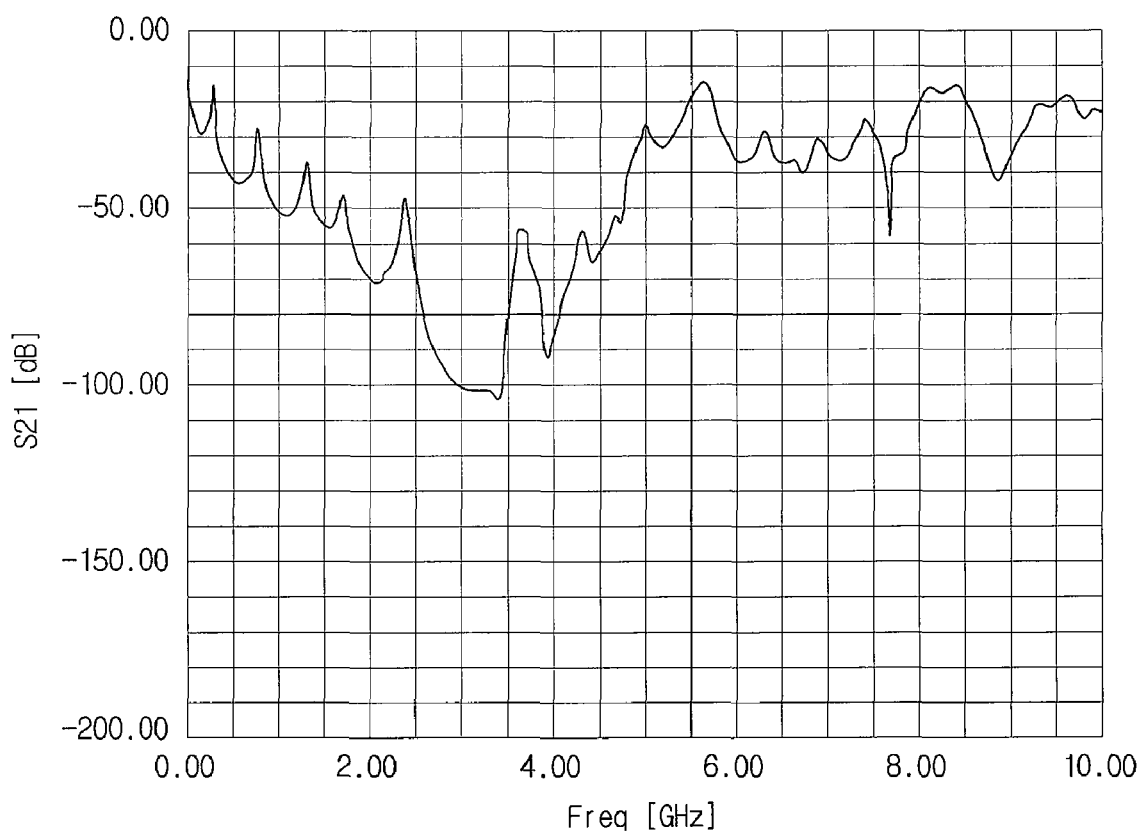
FIG. 9B shows a frequency property graph of the electromagnetic bandgap structure of FIG. 9A.
Figure 10A:
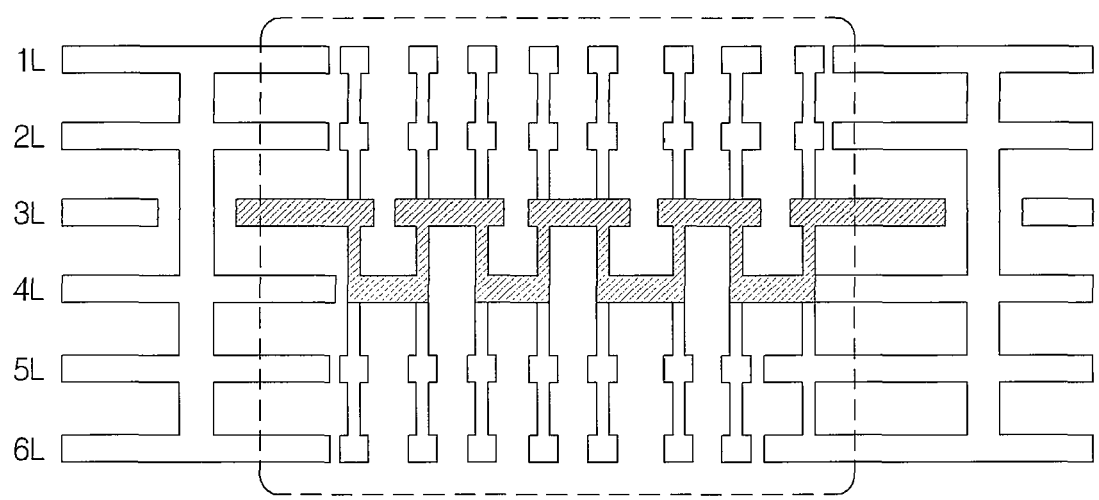
FIG. 10A shows an electromagnetic bandgap structure applied to a six-layered printed circuit board in accordance with an embodiment of the present invention.
Figure 10B:
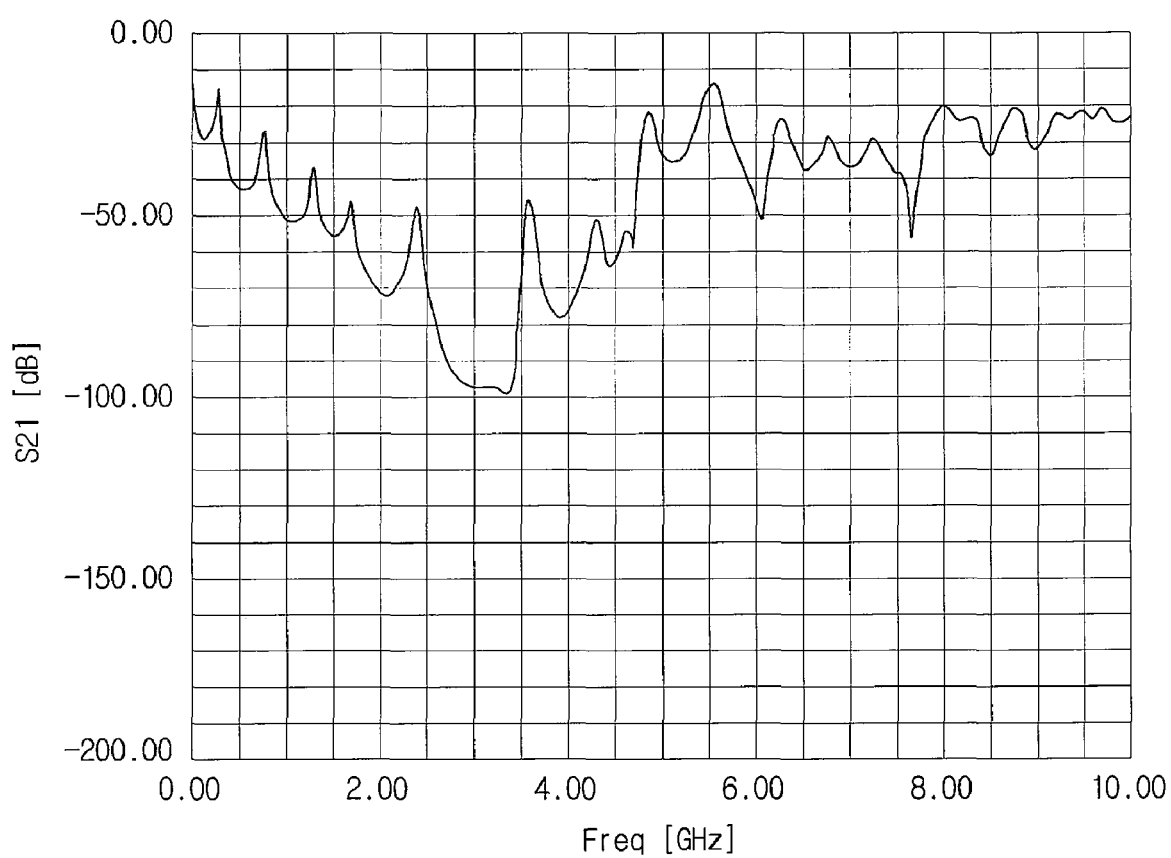
FIG. 10B shows a frequency property graph of the electromagnetic bandgap structure of FIG. 10A.
Figure 11A:
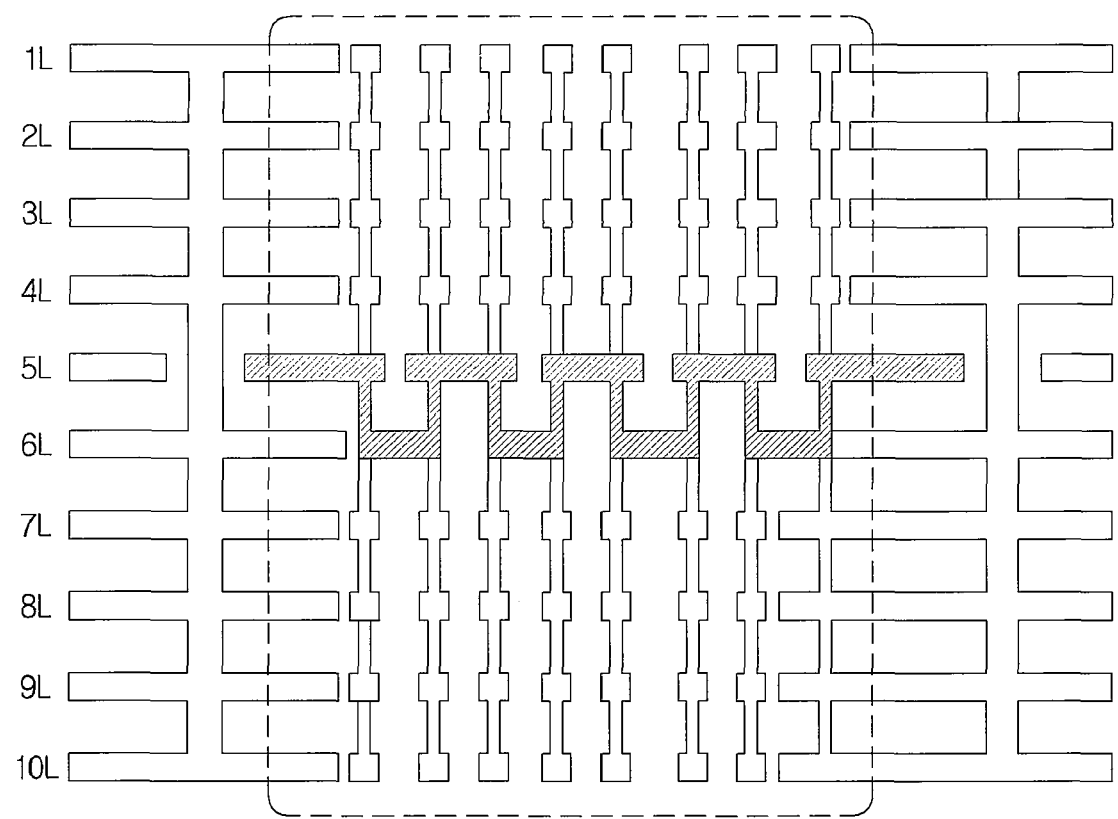
FIG. 11A shows an electromagnetic bandgap structure applied to a ten-layered printed circuit board in accordance with an embodiment of the present invention.
Figure 11B:
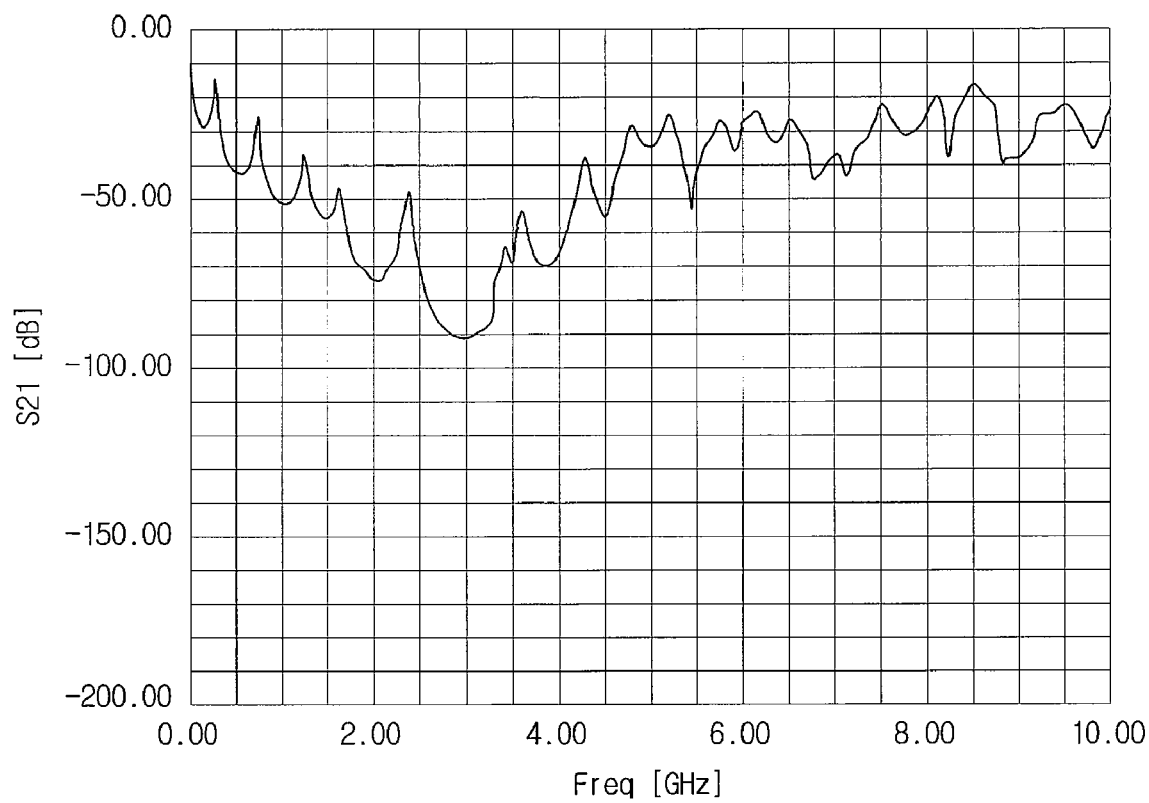
FIG. 11B shows a frequency property graph of the electromagnetic bandgap structure of FIG. 11A.
Figure 12A:
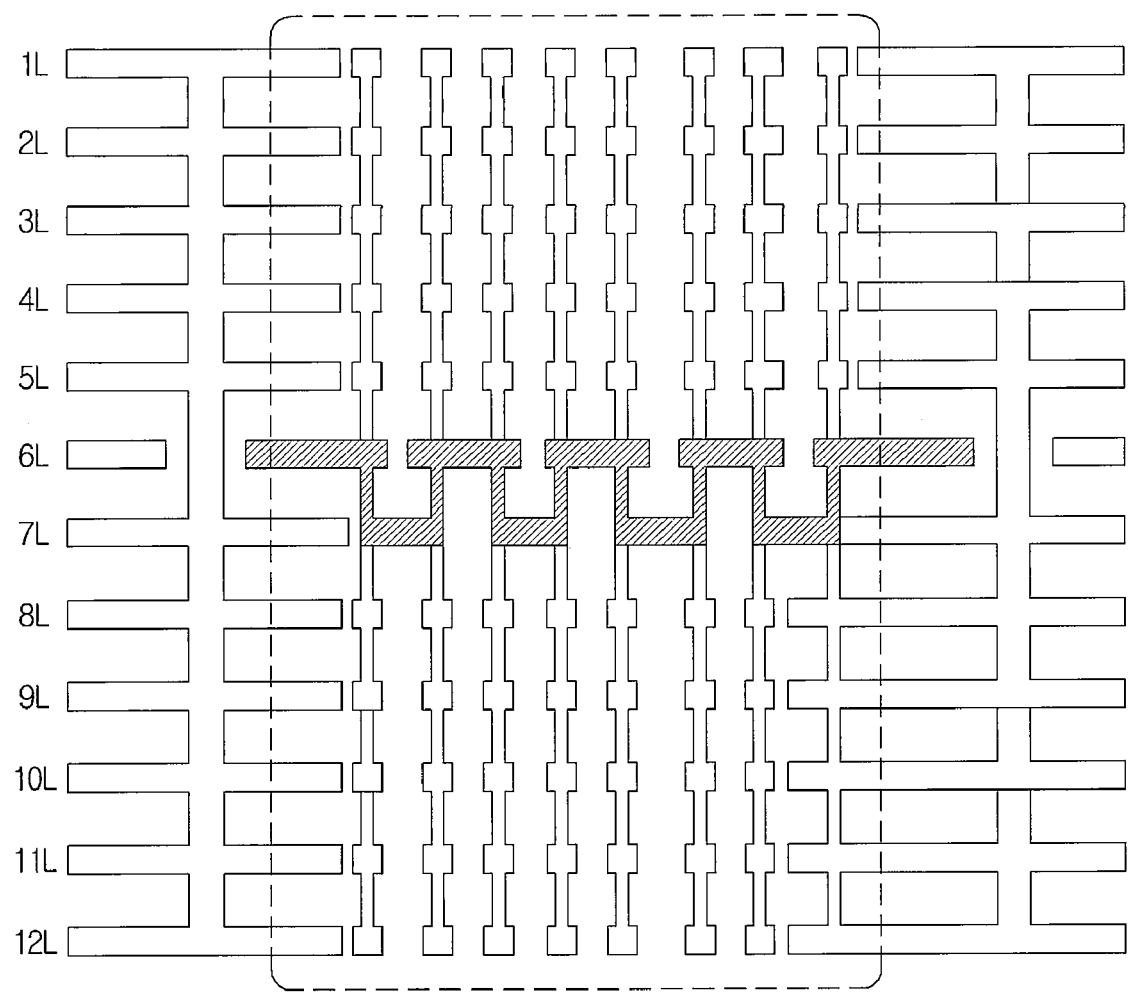
FIG. 12A shows an electromagnetic bandgap structure applied to a twelve-layered printed circuit board in accordance with an embodiment of the present invention.
Figure 12B:
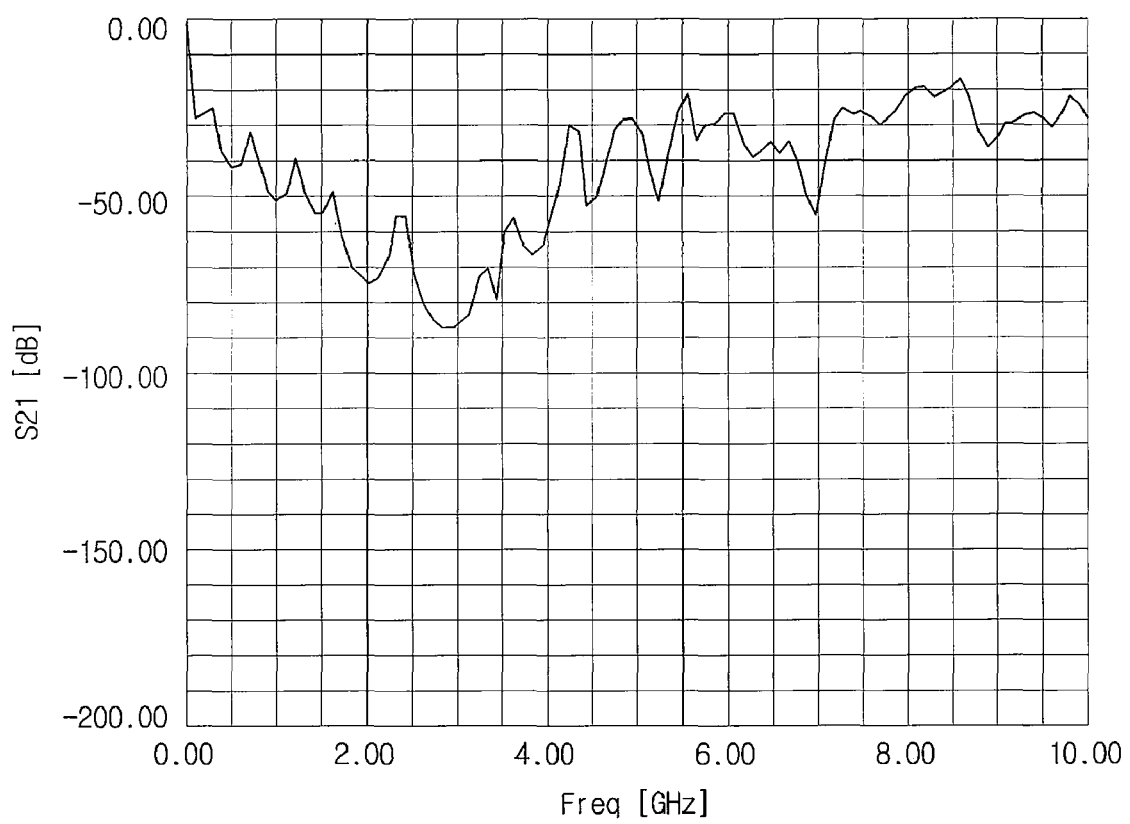
FIG. 12B shows a frequency property graph of the electromagnetic bandgap structure of FIG. 12A.

In addition, FIG. 8B shows the 3-D perspective view of FIG. 8A without a metal layer. As described above, FIG. 8B shows the possibility that no additional metal layer may be placed in an upper part and a lower part, respectively, adjacent to an area in which the electromagnetic bandgap structure (i.e. the metal plates and stitching vias) of the present invention is to be arranged, in a multi-layered printed circuit board.

FIG. 7 is a sectional view showing an electromagnetic bandgap structure including a stitching via and a printed circuit board having the same in accordance with a third embodiment of the present invention.

The electromagnetic bandgap structure in accordance with the third embodiment of the present invention can include a plurality of metal plates placed on a planar surface between two metal layers and stitching vias electrically connecting any two of the metal plates to each other.

For the convenience of describing the drawings and for an easy comparison with the electromagnetic bandgap structure in FIG. 3A, FIG. 3B, FIG. 5, and FIG. 6, a metal layer represented by reference numeral 711 is dubbed a first metal layer 711. Similarly, metal layers represented by reference numerals 712 and 713, metal plates represented by reference numerals 731, 732 and 733, and dielectric layers represented by reference numerals 720, 721 and 722 are dubbed a second metal layer 712 and a third metal layer 713, a first metal plate 731, a second metal plate 732 and a third metal plate 733, and a first dielectric layer 720, a second dielectric layer 721 and a third dielectric layer 722, respectively. However, it is not necessary that the layers represented by reference numerals 721 and 722 be dielectric layers.

Referring to FIG. 7, the first metal plate 731, the second metal plate 732 and the third metal plate 733 can be placed on a planar surface between the first metal layer 711 and the second metal layer 712. Each stitching via can make an electrical connection between the first metal plate 731 and the second metal plate 732 and between the second metal plate 732 and the third metal plate 733. This will be described in detail based on a dotted-line area 700 (i.e. an area related to a stitching via 745 that makes an electrical connection between the first metal plate 731 and the second metal plate 732).

In accordance with the third embodiment of the present invention, the stitching via 745 can include a first via 741 extending from the first metal plate 731 toward a planar surface in which the first layer 711 is placed in one direction and a planar surface in which the second metal layer 712 is placed in anther direction, a second via 742 extending from the second metal plate 732 toward the planar surface in which the first layer 711 is placed in one direction and the planar surface in which the second metal layer 712 is placed in another direction and a connection pattern 743 electrically connecting the first via 741 to the second via 742. The connection pattern 743 can be placed on a planar surface that is different from the planar surface in which the metal plates 731, 732 and 733 are placed, between the first metal layer 711 and the second metal layer 712.

At this time, if there is a metal layer (refer to the third metal layer 713 in FIG. 7) on a same planar surface to correspond to an area in which the connection pattern 743 is to be formed, the connection pattern 743 can be accommodated in a clearance hale (refer to a reference numeral 751 of FIG. 7) formed in a metal layer on the same planar surface. As described above, no additional metal layer may be placed in the area in which the connection pattern 743 is to be formed. In this case, it may be obviously unnecessary that a clearance hole is additionally formed.

Moreover, the stitching via 745 according to the third embodiment of the present invention can further include some areas (refer to reference numerals 741c and 742c of FIG. 7) that extends from the metal plate downwards to a planar surface in which the first metal layer 711 is placed and some areas (refer to reference numerals 741b and 742b of FIG. 7) that extends upwards to the planar surface in which a second metal layer 712 is placed, in addition to some areas (refer to reference numerals 741a and 742a of FIG. 7) placed between the metal plate and the connection pattern. This is structurally different from the stitching via of the electromagnetic bandgap structure shown in FIG. 3A, FIG. 3B, FIG. 5 and FIG. 6.

Here, although FIG. 7 shows that both of the first via 741 and the second via 742 of the stitching via 745 extend toward the same planar surface as the first metal layer 711 and the second metal layer 712, only one of the first via 741 and the second via 742 can extend toward the first metal layer and the second metal layer 712.

At this time, the first via 741 and/or the second via 742, extending from the metal plate downwards toward the first metal layer 711 and upwards toward the second metal layer 712, can be formed by using a plurality of BVHs or IVHs. In the case of the first via 741, for example, an area between the first metal plate 731 and the connection pattern 743, an area between the connection pattern 743 and the same planar surface as the first metal layer 711, and an area between the first metal plate 731 and the same planar surface as the second metal layer 712 are connected to each other by using each additionally formed BVH.

As described above, in consideration of the number of the stacking process of the PCB manufacturing process, however, the first via 741 and/or the second via 742 can be a plated through hole (hereinafter, referred to as "PTH"), which penetrates the first metal layer 711, the connection pattern, the metal plate, and the second metal layer 712.

As also described above, if the metal plate forms a layer that is different from the first metal layer 711 and/or the second metal layer 712 with respect to signals, since it is necessary to electrically disconnect the PTH from the first metal layer 711 and/or the second metal layer 712, a clearance hole (refer to the reference numerals 752 and 753 of FIG. 7) may be required to be formed on an area which the PTH penetrates in the first metal layer 711 and/or the second metal layer 712.

As described above, FIG. 5 through FIG. 7 show that the stitching via electrically connecting the first metal plate to the second metal plate has the same form as the stitching via electrically connecting the second metal plate to the third metal plate. This, however, is by no means to restrict the scope of claims of the present invention. Various modifications are obviously possible. For example, the stitching via electrically connecting the first metal plate to the second metal plate can extend in a direction of the same planar surface as the first metal layer as shown in FIG. 5, and the stitching via electrically connecting the second metal plate to the third metal plate can extend in a direction of the same planar surface as the second metal layer as shown in FIG. 7.

Similarly, although FIG. 5 through FIG. 7 show that a first via and a second via of any one stitching via has the same form, this is also by no means to restrict the scope of claims of the present invention. Various modifications are obviously possible. For example, the first via of the stitching via can extend in the direction of the same planar surface as the first metal layer as shown in FIG. 5, and the second via of the stitching via can extend in the direction of the same planar surface as the second metal layer as shown in FIG. 7.

For the convenience of illustration, even though FIG. 5 through FIG. 7 also show that the first via and/or the second via of the stitching via extends from the metal plate to the same planar surface as the first metal layer and/or the second metal layer as each end point, this is also by no means to restrict the scope of claims of the present invention. Unlike what is shown in each drawing, the first via and/or the second via of the stitching via can obviously extend to another metal layer placed beyond the same planar surface as the first metal layer and/or the second metal layer or to an uppermost (i.e. top) layer of a multi-layered printed circuit board, in the electromagnetic bandgap structure of the present invention.

Hereinafter, a noise blocking effect of a certain frequency band according to the present invention will be described through a frequency property graph when an electromagnetic bandgap structure of the present invention is applied to a multi-layered printed circuit board.

FIG. 9B, FIG. 10B, FIG. 11B, and FIG. 12B show each result of a simulation performed when the electromagnetic bandgap structure (refer to a dotted-line area of each drawing) including the stitching via having the same structural form is applied to 4, 7, 10, and 12-layered printed circuit boards, respectively, as shown in FIG. 9A, FIG 10A, FIG. 11A and FIG. 12A. Here, the simulation results of FIG. 9B, FIG. 10B, FIG. 11B, and FIG. 12B is analyzed by using a scattering parameter.

Referring to each of the simulation results, it can be said that although there are slight differences per layer of the printed circuit boards to which the electromagnetic bandgap structure having the stitching via using the PTH is applied, each corresponding bandgap frequency has a frequency band between 1.4 and 4.8 GHz on the blocking rate (−) 50 dB. This shows that the present invention has the blocking effect to block a signal or noise of a certain frequency band. At this time, the reason that the bandgap frequencies have slightly different bands is that the length of each PTH is varied according to the number of layers of the multi-layered printed circuit board.

Although the above simulation results show that the bandgap frequencies have the frequency band between 1.4 and 4.8 GHz, these results may be varied according to the change of design values such as shapes, lengths, areas, and widths of the first via, the second via, and the connection pattern. In addition, the bandgap frequency and its blocking rate can be obviously varied according to the change of design values such as the size, shape and area of the metal plate and a dielectric constant of a dielectric material forming a dielectric layer.

Accordingly, if a designer adequately control various parameters such as the aforementioned design values, as described above, it is possible to manufacture an electromagnetic bandgap structure capable of blocking a noise or a signal of a certain frequency band.

Although some embodiments of the present invention have been described, anyone of ordinary skill in the art to which the invention pertains should be able to understand that a very large number of permutations are possible without departing the spirit and scope of the present invention and its equivalents, which shall only be defined by the claims appended below.

What is claimed is:

1. An electromagnetic bandgap structure, comprising:
    a plurality of conductive plates, placed between two conductive layers; and
    a stitching via, configured to make an electrical connection between any two of the conductive plates,
    wherein the stitching via comprises
    a first via, one end part of the first via being connected to any one of the two conductive plates;
    a second via, one end part of the second via being connected to the other of the two conductive plates; and
    a connection pattern, placed on a planar surface that is different from the conductive plates, between the two conductive layers and configured to make an electrical connection between the other end part of the first via and the other end part of the second via,
    whereas any one of the first via and the second via, which is a plated through hole (PTH)), penetrates at least one of the two conductive layers and is electrically disconnected from one of the penetrated conductive layers.

2. The structure of claim 1, wherein the other of the first via and the second via, which is a PTH, penetrates at least one of the two conductive layers, and is electrically disconnected from one of the penetrated conductive layers.

3. The structure of claim 1, wherein, if a conductive layer is placed on an area in which the connection pattern is to be formed, the connection pattern is accommodated in a clearance hole, which is formed on the conductive layer placed on the same planer surface as the connection pattern.

4. The structure of claim 1, wherein the conductive plates are arranged in one or more row on some or all parts of a planar surface, between the two conductive layers.

5. A printed circuit board, comprising: an electromagnetic bandgap structure, arranged in an area of a noise transferable path between a noise source point and a noise blocking destination point of the printed circuit board,
  wherein the electromagnetic bandgap structure comprises
    a plurality of conductive plates, placed between two conductive layers; and
    a stitching via, configured to make an electrical connection between any two of the conductive plates, and
    the stitching via comprises
    a first via, one end part of the first via configured to any one of the two conductive plates;
    a second via, one end part of the second via configured to the other of the two conductive plates; and
    a connection pattern, placed on a planar surface that is different from the conductive plates, between the two conductive layers and configured to make an electrical connection between the other end part of the first via and the other end part of the second via,
  whereas any one of the first via and the second via, which is a plated through hole (PTH), penetrates at least one of the two conductive layers, and is electrically disconnected from one of the penetrated conductive layers.

6. The board of claim 5, wherein the other of the first via and the second via, which is a PTH, penetrates at least one of the two conductive layers, and is electrically disconnected from one of the penetrated conductive layers.

7. The board of claim 5, wherein, if a conductive layer is placed on an area in which the connection pattern is to be formed, the connection pattern is accommodated in a clearance hole, which is formed on the conductive layer placed on the same planer surface as the connection pattern.

8. The board of claim 5, wherein at least one of the two conductive layers forms a layer that is different from the conductive plates with respect to electrical signals 9. The board of claim 5, wherein the conductive plates are arranged in one or more row on some or all parts of a planar surface, between the two conductive layers.

* * * * *